United States Patent
Horiike et al.

(10) Patent No.: US 8,946,798 B2
(45) Date of Patent: Feb. 3, 2015

(54) SOLID-STATE IMAGING DEVICE AND ELECTRONIC EQUIPMENT

(71) Applicant: Sony Corporation, Tokyo (JP)

(72) Inventors: Machiko Horiike, Kanagawa (JP); Kazuichiro Itonaga, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/920,580

(22) Filed: Jun. 18, 2013

(65) Prior Publication Data

US 2013/0278807 A1 Oct. 24, 2013

Related U.S. Application Data

(63) Continuation of application No. 13/273,887, filed on Oct. 14, 2011, now Pat. No. 8,519,459.

(30) Foreign Application Priority Data

Oct. 21, 2010 (JP) .................. 2010-236420

(51) Int. Cl.
*H01L 33/00* (2010.01)
*H01L 27/146* (2006.01)
*H04N 5/374* (2011.01)

(52) U.S. Cl.
CPC .... *H01L 27/14605* (2013.01); *H01L 27/14638* (2013.01); *H01L 27/14634* (2013.01); *H04N 5/374* (2013.01); *H01L 27/14636* (2013.01); *H01L 27/14623* (2013.01)
USPC .... 257/294; 257/432; 257/433; 257/E21.211; 257/E23.141; 257/E31.051

(58) Field of Classification Search
CPC ............... H01L 27/1464; H01L 27/14623; H01L 27/14625; H01L 23/481; H01L 31/0232
USPC ............. 257/294, 432, 433, E21.211, 23.141, 257/31.054, 131
See application file for complete search history.

(56) References Cited

U.S. PATENT DOCUMENTS

| 4,446,372 | A | 5/1984 | Gurnee |
| 5,227,313 | A | 7/1993 | Gluck et al. |
| 8,274,124 | B2 | 9/2012 | Lin et al. |

(Continued)

FOREIGN PATENT DOCUMENTS

| JP | 2006-049361 | 2/2006 |
| JP | 2006-129762 | 5/2006 |

(Continued)

OTHER PUBLICATIONS

Japanese Office Action issued in connection with related Japanese patent application No. 2010-236420 dated May 27, 2014.

*Primary Examiner* — Michael Lebentritt
(74) *Attorney, Agent, or Firm* — Dentons US LLP

(57) ABSTRACT

A backside illumination type solid-state imaging device includes stacked semiconductor chips which are formed such that two or more semiconductor chip units are bonded to each other, at least a first semiconductor chip unit is formed with a pixel array and a first multi-layered wiring layer, and a second semiconductor chip unit is formed with a logic circuit and a second multi-layered wiring layer, a connection wire which connects the first semiconductor chip unit and the second semiconductor chip unit, and a first shield wire which shields adjacent connection wires in one direction therebetween.

16 Claims, 14 Drawing Sheets

(56) References Cited

U.S. PATENT DOCUMENTS

| | | | |
|---|---|---|---|
| 8,519,459 B2 * | 8/2013 | Horiike et al. | ............ 257/294 |
| 2006/0023109 A1 | 2/2006 | Mabuchi et al. | |
| 2006/0197007 A1 | 9/2006 | Iwabuchi et al. | |
| 2009/0185060 A1 * | 7/2009 | Akiyama | ............ 348/294 |
| 2009/0315132 A1 | 12/2009 | Kohyama | |
| 2010/0060764 A1 | 3/2010 | McCarten et al. | |
| 2010/0096677 A1 | 4/2010 | Inoue | |
| 2010/0133635 A1 * | 6/2010 | Lee et al. | ............ 257/433 |
| 2012/0086092 A1 | 4/2012 | Yanagita et al. | |
| 2012/0105696 A1 | 5/2012 | Maeda | |
| 2012/0153419 A1 | 6/2012 | Itonaga et al. | |
| 2012/0275480 A1 | 11/2012 | Koike | |

FOREIGN PATENT DOCUMENTS

| | | |
|---|---|---|
| JP | 2009-170448 | 7/2009 |
| WO | 2006/129762 | 12/2006 |
| WO | WO 2010/030329 A1 | 3/2010 |

* cited by examiner

151

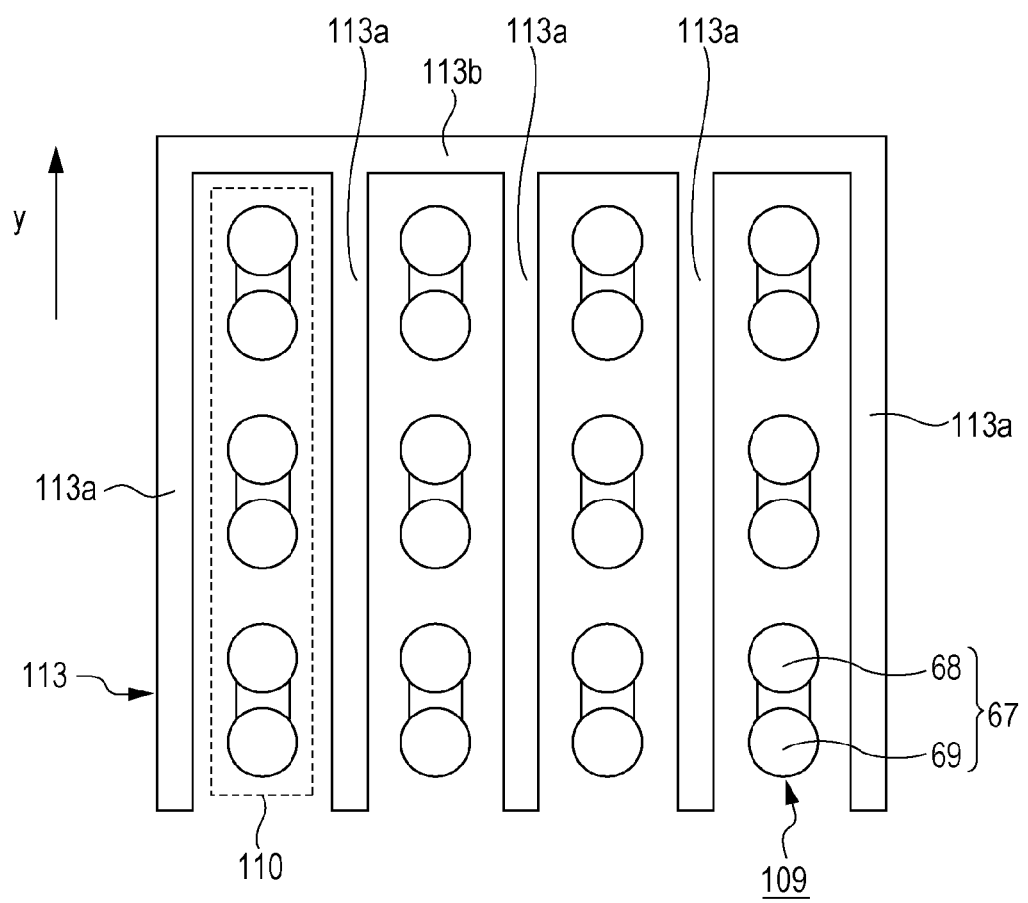

SOLID-STATE IMAGING DEVICE AND ELECTRONIC EQUIPMENT

RELATED APPLICATION DATA

This application is a continuation of U.S. patent application Ser. No. 13/273,887 filed Oct. 14, 2011, the entirety of which is incorporated herein by reference to the extent permitted by law. The present application claims the benefit of priority to Japanese Patent Application No. JP 2010-236420 filed on Oct. 21, 2010 in the Japan Patent Office, the entirety of which is incorporated by reference herein to the extent permitted by law.

BACKGROUND

The present disclosure relates to a solid-state imaging device and electronic equipment such as a camera provided with the solid-state imaging device.

As a solid-state imaging device, there is an amplification type solid-state imaging device represented by an MOS-type image sensor such as a CMOS (Complementary Metal Oxide Semiconductor). In addition, there is a charge-transfer type solid-state imaging device represented by a CCD (Charge Coupled Device) image sensor. The solid-state imaging devices are widely used in digital still cameras, digital video cameras, and the like. In recent years, as a solid-state imaging device mounted on mobile equipment including mobile telephones with camera, PDAs (Personal Digital Assistants), and the like, the MOS-type image sensor is widely used in the light of power consumption as the voltage of the power supply is low.

Such an MOS-type solid-state imaging device is formed of a photodiode of which a unit pixel serves as a photoelectric conversion unit and a plurality of pixel transistors, and is configured to have a pixel array in which a plurality of unit pixels is arrayed in a two-dimensional array shape (pixel area) and the peripheral circuit area. The plurality of pixel transistors is formed with MOS transistors, and configured to include three transistors of a transfer transistor, a reset transistor, an amplification transistor, or four transistors by adding a selection transistor thereto.

In such MOS-type solid-state imaging devices of the related art, solid-state imaging devices have been variously proposed, which is configured to be one device by electrically connecting a semiconductor chip, in which a pixel array arranged with a plurality of pixels is formed, and a semiconductor chip, in which a logic circuit performing signal processing is formed. For example, in Japanese Unexamined Patent Application Publication No. 2006-49361, a semiconductor module is disclosed, in which a backside illumination type image sensor chip having micro-pads for each pixel cell and a signal processing chip having micro-pads formed with a signal processing circuit are connected to each other by micro-bumps.

In International Publication No. WO 2006/129762, a semiconductor image sensor module is disclosed, in which a first semiconductor chip provided with an image sensor, a second semiconductor chip provided with an analog/digital converter array, and a third semiconductor chip provided with a memory element array are stacked. The first semiconductor chip and the second semiconductor chip are connected by a bump that is a conductive connection conductor. The second semiconductor chip and the third semiconductor chip are connected by a penetration contact which penetrates the second semiconductor chip.

As shown in Japanese Unexamined Patent Application Publication No. 2006-49361, and the like, a technique of mounting different kinds of circuit chips including an image sensor chip, a logic circuit performing signal processing, and the like by mixing has been variously proposed. In the related art, a through connection hole is formed in a state where functional chips are almost completed and connects the chips to each other, or the chips are connected to each other by a bump.

SUMMARY

The present applicant previously proposed a solid-state imaging device where a semiconductor chip unit provided with a pixel array and a semiconductor chip unit provided with a logic circuit are bonded together so as to satisfactorily exhibit performance of each unit, intending high performance, mass production, and cost reduction. The solid-state imaging device is made such that a first semiconductor chip unit provided with a pixel array in a half-processed state and a second semiconductor chip unit provided with a logic circuit are bonded together, the first semiconductor chip unit is made into a thin film, and the pixel array and the logic circuit are connected to each other. The connection is attained by forming a connection conductor which is connected to necessary wires of the first semiconductor chip unit, a penetrating connection conductor which penetrates the first semiconductor chip unit and is connected to necessary wires of the second semiconductor chip unit, and connection wires constituted by a coupling conductor which couples both connection conductors. Then, the device is made into a chip in a finished product state and configured as a backside illumination type solid-state imaging device.

In the solid-state imaging device, the connection conductor and the penetrating connection conductor are formed so as to be buried in a through hole that penetrates a silicon substrate of the first semiconductor chip unit via an insulating film. The traverse areas of the connection conductor and the penetrating connection conductor are relatively large. For this reason, when it is difficult to ignore parasitic capacity occurring between the connection conductor and the penetrating connection conductor and the silicon substrate, it was found that the parasitic capacity causes a reduction in the driving speed of circuits and contributes to hindrance of high performance of the solid-state imaging device.

Furthermore, in the solid-state imaging device with the configuration in which bonded semiconductor chip units are connected by the connection conductor and the penetrating connection conductor, each wire corresponding to each vertical signal line (in other words, a drawing wire) is connected to the above-described paired conductors (the connection conductor and the penetrating connection conductor). In that case, capacity at the ground and adjacent coupling capacity, which are parasitic capacity, occur. The capacity at the ground is parasitic capacity between wires and a semiconductor substrate that has, for example, a ground potential. The adjacent coupling capacity is parasitic capacity between adjacent drawing wires or between adjacent paired conductors. The capacity at the ground can be resolved if power supply is reinforced, or a current is made to run by providing a buffer circuit. However, it is not possible to resolve the adjacent coupling capacity because there is interference between adjacent columns.

It is desirable to provide a solid-state imaging device which suppresses at least the adjacent coupling capacity and has high performance. In addition it is desirable to provide electronic equipment such as a camera provided with the solid-state imaging device.

According to an embodiment of the present disclosure, there is provided a backside illumination type solid-state imaging device which includes stacked semiconductor chips which are formed such that two or more semiconductor chip units are bonded to each other, at least a first semiconductor chip unit is formed with a pixel array and a first multi-layered wiring layer, and a second semiconductor chip unit is formed with a logic circuit and a second multi-layered wiring layer. Furthermore, the disclosure includes a connection wire which connects the first semiconductor chip unit and the second semiconductor chip unit and a first shield wire which shields adjacent connection wires in one direction therebetween. The connection wire includes a connection conductor which is connected to a first connection pad connected to a necessary first wire in the first multi-layered wiring layer, a penetrating connection conductor which penetrates the first semiconductor chip unit and is connected to a second connection pad connected to a necessary second wire in the second multi-layered wiring layer. Furthermore, the connection wire is formed including a coupling conductor which couples the connection conductor and the penetrating connection conductor. The first shield wire is formed with a wiring in a necessary layer in the first multi-layered wiring layer and/or the second multi-layered wiring layer. The solid-state imaging device of the disclosure is configured as a backside illumination type solid-state imaging device.

In the solid-state imaging device of the embodiment of the disclosure, the first shield wire which shields adjacent connection wires in one direction therebetween is included, and the first shield wire is formed with a wiring in a necessary layer in the first multi-layered wiring layer and/or the second multi-layered wiring layer, whereby it is possible to suppress adjacent coupling capacity. In addition, since the first shield wire is formed using the wiring in the multi-layered wiring layer without increasing the number of wiring processes, the configuration is simplified and a solid-state imaging device of that kind is easily manufactured.

As a preferable embodiment of the solid-state imaging device according to the disclosure, the solid-state imaging device may further include a second shield wire which shields the connection wire and the first wire and the second wire connected to another connection wire adjacent thereto. The second shield wire may be formed with a wiring in a necessary layer in the first multi-layered wiring layer and the second multi-layered wiring layer.

In the solid-state imaging device of the embodiment of the disclosure, adjacent coupling capacity between adjacent connection wires is suppressed by the first shield wire, and a second shield wire shields the connection wire and the first wire and the second wire connected to another wire adjacent thereto therebetween. The second shield wire is also formed with a wiring in a necessary layer in the first multi-layered wiring layer and the second multi-layered wiring layer. Accordingly, it is possible to suppress the whole adjacent coupling capacity between adjacent connection wires and between the connection wire and the first and the second wires adjacent thereto.

According to another embodiment of the present disclosure, there is provided a backside illumination type solid-state imaging device which includes stacked semiconductor chips which are formed such that two or more semiconductor chip units are bonded to each other, at least a first semiconductor chip unit is formed with a pixel array and a first multi-layered wiring layer, and a second semiconductor chip unit is formed with a logic circuit and a second multi-layered wiring layer. Furthermore, the disclosure includes a connection wire which connects the first semiconductor chip unit and the second semiconductor chip unit and a second shield wire which shields a first wire and a second wire connected to another connection wire adjacent thereto therebetween. The connection wire includes a connection conductor which is connected to a first connection pad connected to a necessary first wire in the first multi-layered wiring layer, a penetrating connection conductor which penetrates the first semiconductor chip unit and is connected to a second connection pad connected to a necessary second wire in the second multi-layered wiring layer. Furthermore, the connection wire is formed including a coupling conductor which couples the connection conductor and the penetrating connection conductor. The second shield wire is formed with a wiring in a necessary layer in the first multi-layered wiring layer and the second multi-layered wiring layer. The solid-state imaging device of the disclosure is configured as a backside illumination type solid-state imaging device.

In the solid-state imaging device of the embodiment of the disclosure, since the second shield wire is included between the connection wire and the first wire and the second wire connected to another connection wire adjacent thereto, it is possible to easily suppress adjacent coupling capacity between the connection wire and the first and the second wires. In addition, since the second shield wire is formed using the wiring in a multi-layered wiring layer without increasing the number of wiring processes, the configuration is simplified and a solid-state imaging device of this kind is easily manufactured.

According to still another embodiment of the disclosure, there is provided electronic equipment which includes a solid-state imaging device, an optical system which guides incident light to a photoelectric conversion unit of the solid-state imaging device, and a signal processing circuit which processes output signals of the solid-state imaging device. The solid-state imaging device includes stacked semiconductor chips which are formed such that two or more semiconductor chip units are bonded to each other, at least a first semiconductor chip unit is formed with a pixel array and a first multi-layered wiring layer, and a second semiconductor chip unit is formed with a logic circuit and a second multi-layered wiring layer; a connection wire which connects the first semiconductor chip unit and the second semiconductor chip unit; and a first shield wire which shields adjacent connection wires in one direction therebetween, in which the connection wire includes a connection conductor which is connected to a first connection pad connected to a necessary first wire in the first multi-layered wiring layer, a penetrating connection conductor which penetrates the first semiconductor chip unit and is connected to a second connection pad connected to a necessary second wire in the second multi-layered wiring layer, and a coupling conductor which couples the connection conductor and the penetrating connection conductor, and the first shield wire is formed with a wiring in a necessary layer in the first multi-layered wiring layer and/or the second multi-layered wiring layer.

In the electronic equipment of the embodiment of the disclosure, it is possible to suppress adjacent coupling capacity between adjacent connection wires in the solid-state imaging device, and/or between the connection wire and the first and the second wires connected to another connection wire adjacent thereto.

According to the solid-state imaging device according to the embodiments of the disclosure, it is possible to suppress coupling capacity between adjacent connection wires and/or coupling capacity between the connection wire and the first and the second wires connected to another connection wire adjacent thereto, and to provide a solid-state imaging device with high performance.

According to the electronic equipment according to the embodiments of the disclosure, it is possible to provide electronic equipment such as a high-quality camera by being provided with a backside illumination type solid-state imaging device which includes bonded chips and aims at high performance by suppressing adjacent coupling capacity.

BRIEF DESCRIPTION OF THE DRAWINGS

FIG. 9 is a plane diagram of principal portions showing a fifth embodiment of the solid-state imaging device according to the disclosure;

DETAILED DESCRIPTION OF EMBODIMENTS

Hereinafter, embodiments for implementing the disclosure (hereinafter, referred to as embodiments) will be described. Description will be provided in the following order.

1. Outlined Configuration Example of MOS Solid-State Imaging Device
2. MOS Solid-state Imaging Device applied to the Disclosure (Configuration Example of Solid-State Imaging Device)
3. First Embodiment (Configuration Example of Solid-State Imaging Device)
4. Second Embodiment (Configuration Example of Solid-State Imaging Device)
5. Third Embodiment (Configuration Example of Solid-State Imaging Device)
6. Fourth Embodiment (Configuration Example of Solid-State Imaging Device)
7. Fifth Embodiment (Configuration Example of Solid-State Imaging Device)
8. Sixth Embodiment (Configuration Example of Solid-State Imaging Device)
9. Seventh Embodiment (Configuration Example of Solid-State Imaging Device)
10. Eighth Embodiment (Configuration Example of Solid-State Imaging Device)
11. Ninth Embodiment (Configuration Example of Solid-State Imaging Device)
12. Tenth Embodiment (Configuration Example of Solid-State Imaging Device)
13. Eleventh Embodiment (Electronic Equipment)<

1. Outlined Configuration Example of MOS Solid-State Imaging Device

Figure 1:
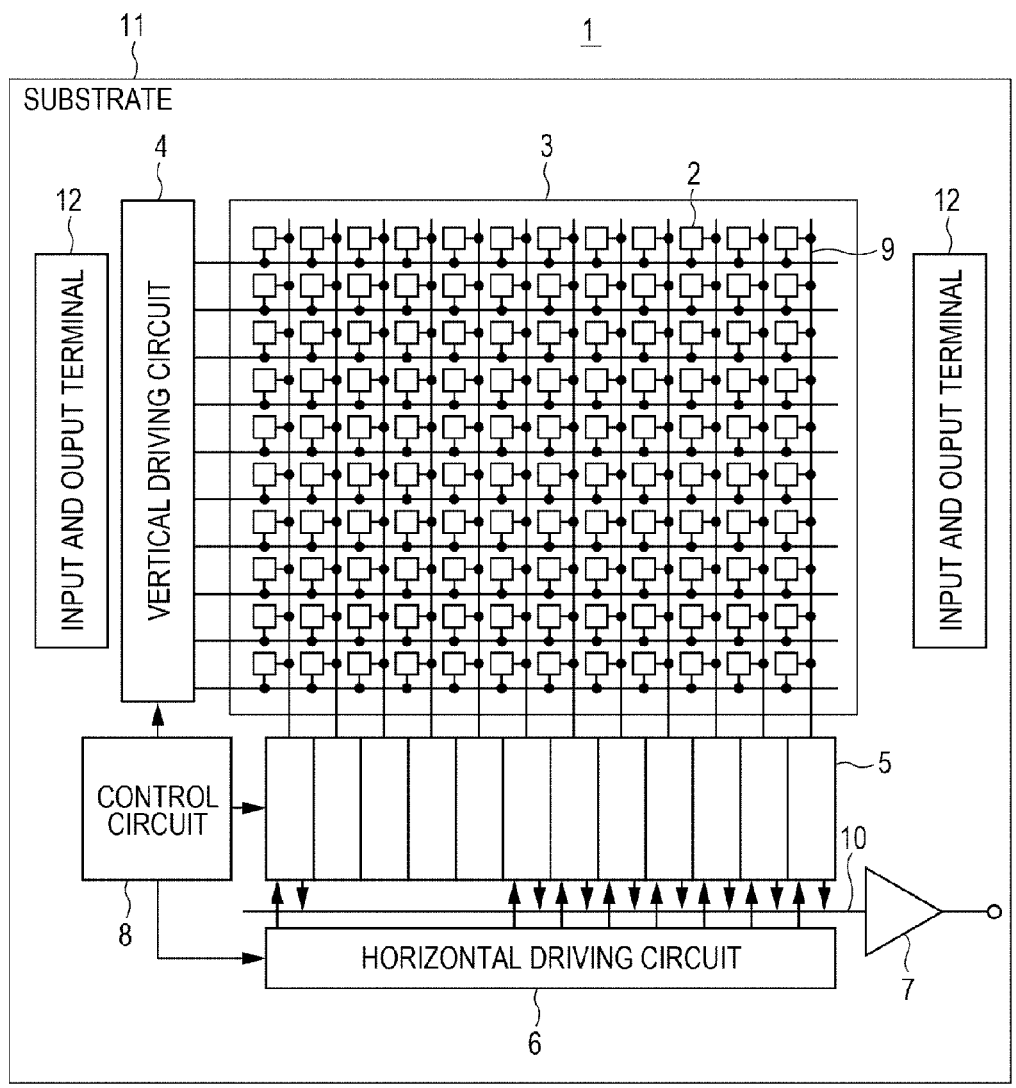
FIG. 1 is an outlined configuration diagram showing an example of an MOS solid-state imaging device to which the disclosure is applied.

FIG. 1 shows an outlined configuration of an MOS solid-state imaging device which is applied to a semiconductor device of the disclosure. The MOS solid-state imaging device is applied to solid-state imaging devices of each embodiment. As shown in FIG. 1, the solid-state imaging device 1 of this example is configured to include a pixel array (so-called pixel area) 3 in which pixels 2 including a plurality of photoelectric conversion units on a semiconductor substrate 11, for example, a silicon substrate are regularly arranged in a two-dimensional array shape and the peripheral circuit part. The pixel 2 is formed with, for example, a photodiode serving as a photoelectric conversion unit and a plurality of pixel transistors (so-called MOS transistors). The plurality of pixel transistors can be constituted by three transistors, for example, a transfer transistor, a reset transistor, and an amplification transistor. In addition, the plurality of pixel transistors can be constituted by four transistors by adding a selection transistor thereto. Since an equivalence circuit of a unit pixel is the same as usual one, detailed description will be omitted. The pixel 2 can be configured as one unit pixel. In addition, the pixel 2 also can have a shared pixel structure. The shared pixel structure is constituted by a plurality of photodiodes, a plurality of transfer transistors, one shared floating diffusion, and each one of other shared pixel transistors.

The peripheral circuit part is constituted by a vertical driving circuit 4, column signal processing circuits 5, a horizontal driving circuit 6, an output circuit 7, a control circuit 8, and the like.

The control circuit 8 receives input clocks and data for instructing an operation mode, and the like, and outputs data of internal information of the solid-state imaging device, or the like. In other words, the control circuit 8 generates clock signals or control signals which serve as a reference of operations of the vertical driving circuit 4, the column signal processing circuit 5, the horizontal driving circuit 6, and the like, based on vertical synchronization signals, horizontal synchronization signals, and master clocks. In addition, the control circuit inputs these signals to the vertical driving circuit 4, the column signal processing circuit 5, the horizontal driving circuit 6, and the like.

The vertical driving circuit 4 includes, for example, a shift register, selects a pixel driving wire, supplies a pulse for driving a pixel to the selected pixel driving wire, and drives pixels in a unit of row. In other words, the vertical driving circuit 4 sequentially selects and scans each pixel 2 of the pixel array 3 in a unit of row in the vertical direction, supplies a pixel signal based on signal charges generated according to the amount of sensed light in, for example, the photodiode serving as the photoelectric conversion unit of each pixel 2 to the column signal processing circuit 5 through a vertical signal line 9.

The column signal processing circuit 5 is arranged for, for example, each column of the pixel 2, and performs signal processing such as removing noise of signals output from pixels 2 for one row for each pixel column. In other words, the column signal processing circuit 5 performs signal processing such as a CDS for removing fixed pattern noise unique for the pixel 2, signal amplification, AD conversion, or the like. In the output stage of the column signal processing circuit 5, a horizontal selection switch (not shown in the drawing) is provided by being connected between the horizontal signal line 10.

The horizontal driving circuit 6 includes, for example a shift register, sequentially selects each of the column signal processing circuits 5 by sequentially outputting horizontal scanning pulses, and causes pixel signals from each of the column signal processing circuits 5 to be output to the horizontal signal line 10.

The output circuit 7 performs signal processing for the signal sequentially supplied from each of the column signal processing circuits 5 through the horizontal signal line 10 and outputs. There are cases, for example, where only buffering is performed, and adjustment of black level, correction of column unevenness, various digital signal processing, or the like is performed. An input and output terminal 12 exchanges signals with the outside.

Figure 2A:
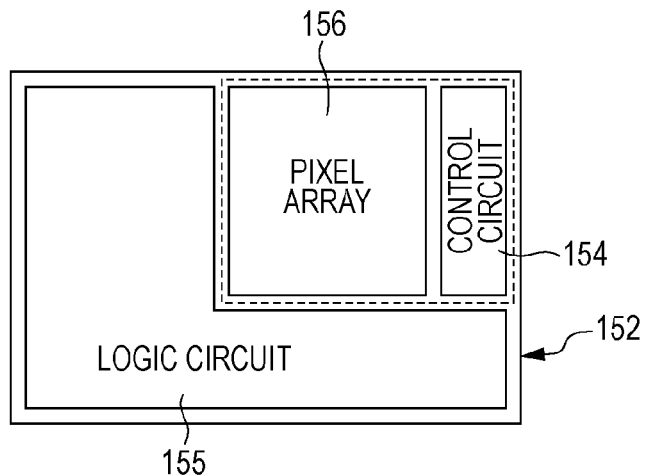
FIGS. 2A, 2B and 2C are schematic diagrams of the solid-state imaging device according to an embodiment of the disclosure and a solid-state imaging device according to the related art.
Figure 2B:
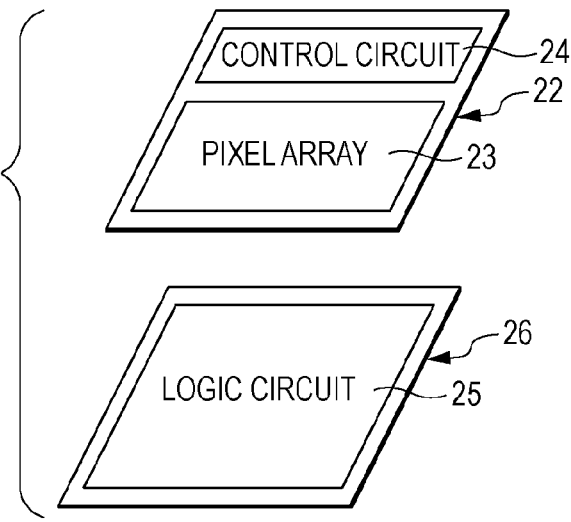
Figure 2C:
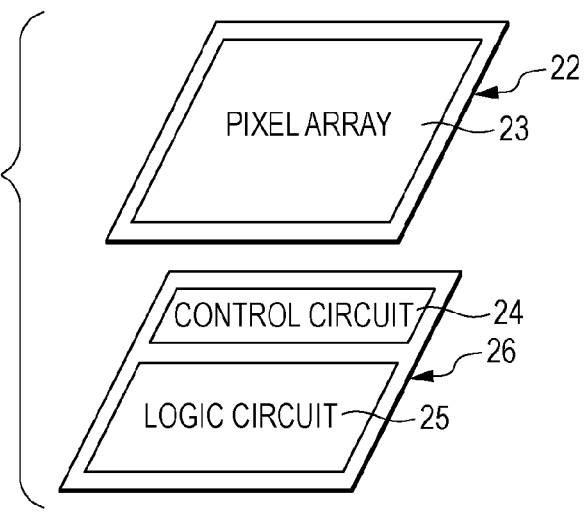

FIGS. 2A to 2C show basic outlined configurations of MOS solid-state imaging devices according to the disclosure. As shown in FIG. 2A, an MOS solid-state imaging device 151 of the related art is configured to be mounted with a pixel array 153, a control circuit 154, and a logic circuit 155 for signal processing in one semiconductor chip 152. Generally, the pixel array 153 and the control circuit 154 constitute an image sensor 156. On the other hand, an MOS solid-state imaging device 21 according to an embodiment of the disclosure has a first semiconductor chip unit 22 mounted with a pixel array 23 and a control circuit 24, and has a second semiconductor chip unit 26 mounted with a logic circuit 25 including a signal processing circuit for processing signals, as shown in FIG. 2B. The MOS solid-state imaging device 21 is constituted as one semiconductor chip by electrically connecting both the first and second semiconductor chip units 22 and 26. As shown in FIG. 2C, an MOS solid-state imaging device 27 according to another embodiment of the disclosure has the first semiconductor chip unit 22 mounted with the pixel array 23, and has the second semiconductor chip unit 26 mounted with the control circuit 24 and the logic circuit 25 including a signal processing circuit. An MOS solid-state imaging device 27 is constituted as one semiconductor chip by electrically connecting both the first and second semiconductor chip units 22 and 26.

Although not shown in the drawing, depending on a configuration of an MOS solid-state imaging device, two or more semiconductor chip units can be bonded. For example, it is possible to configure an MOS solid-state imaging device by bonding three or more semiconductor chip units by adding a semiconductor chip unit provided with a memory element array, a semiconductor chip unit provided with other circuit element than the above-described first and second semiconductor chips to be one chip.

2. MOS Solid-State Imaging Device Applied to the Disclosure

Configuration Example of Solid-State Imaging Device

Figure 3:
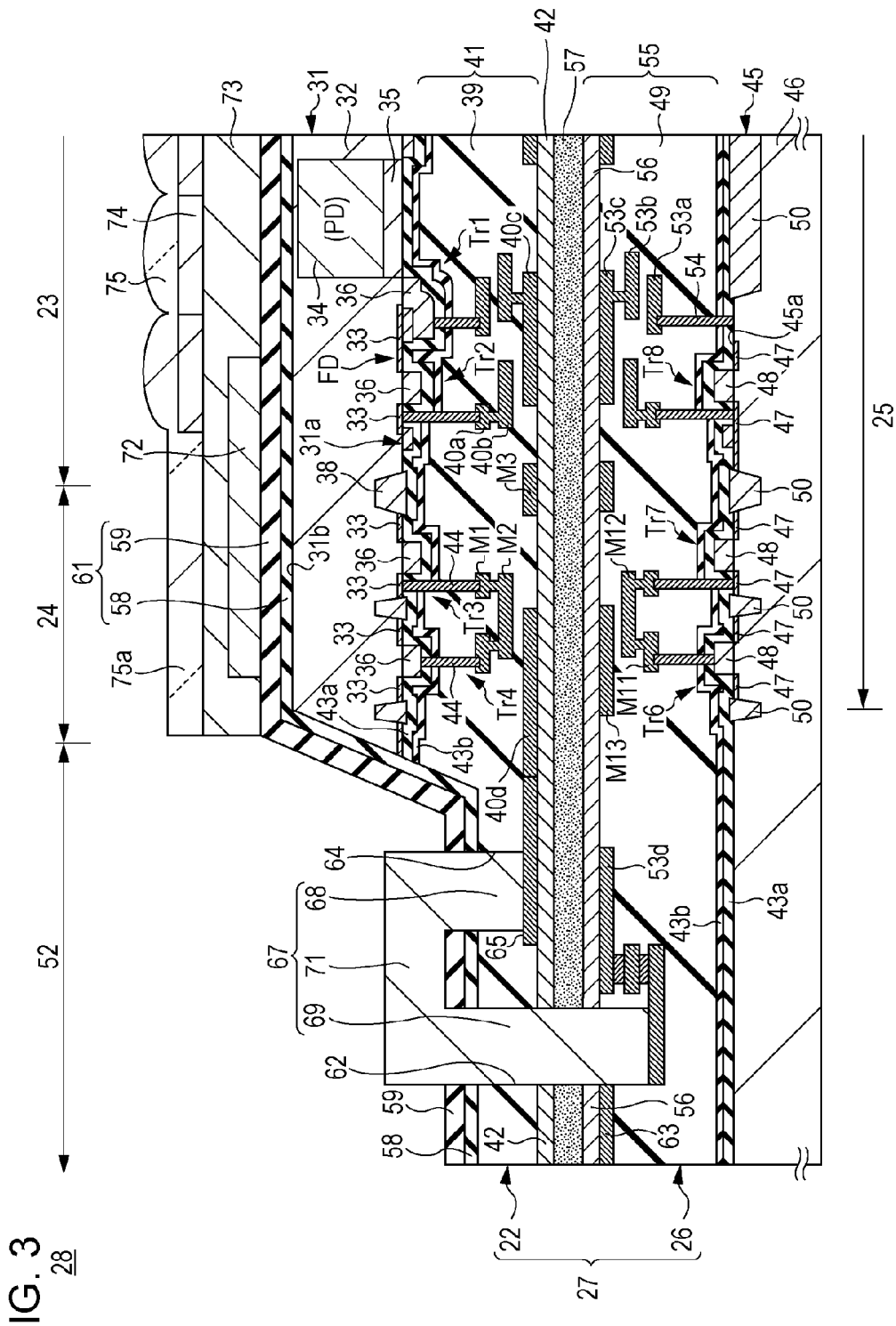
FIG. 3 is a cross-sectional diagram showing principal portions of a backside illumination type MOS solid-state imaging device to which an embodiment of the disclosure is applied.

FIG. 3 shows an embodiment of a backside illumination type MOS solid-state imaging device applied to the disclosure. An MOS solid-state imaging device 28 according to the embodiment is configured to include a stacked semiconductor chip 27 obtained by bonding the first semiconductor chip unit 22 formed with the pixel array 23 and the control circuit 24 and the second semiconductor chip unit 26 formed with the logic circuit 25. The first semiconductor chip unit 22 and the second semiconductor chip unit 26 are bonded such that multi-layered wired layers 41 and 55 thereof face each other. The bonding is achieved with an adhesive layer 57 via protective films 42 and 56 in the example. In addition to that, the bonding can be achieved by plasma joining.

In the embodiment, a semiconductor removed area 52 is formed, which is obtained by removing a part of the semiconductor portion of the first semiconductor chip unit 22, and in the semiconductor removed area 52, a connection wire 67 which connects the first semiconductor chip unit 22 and the second semiconductor chip unit 26 is formed. The semiconductor removed area 52 is the entire area including the portion where each connection wire 67 is formed, which is connected to drawing wires 40d and 53d corresponding to each vertical signal line of the pixel array 23, and formed outside the pixel array 23. The semiconductor removed area 52 corresponds to a so-called electrode pad area.

The first semiconductor chip unit 22 has a first semiconductor substrate 31 which is made into a thin film formed with the pixel array 23, which includes a photodiode serving as a photoelectric conversion unit and a plurality of pixel transistors Tr1 and Tr2, and the control circuit 24, which includes MOS transistors Tr3 and Tr4. The pixel transistors Tr1 and Tr2 and the MOS transistors Tr3 and Tr4 are shown as representatives, respectively. In the side of a surface 31a of the semiconductor substrate 31, the multi-layered wiring layer 41 is formed on which wiring 40 [40a, 40b, and 40c] by a plurality of, for example, three layers of metals M1 to M3 in three layers in this example is arranged through an interlayer insulating film 39.

The second semiconductor chip unit 26 has a second semiconductor substrate 45 formed with the logic circuit 25 including MOS transistors Tr6 to Tr8. In the side of a surface 45a of the semiconductor substrate 45, the multi-layered wiring layer 55 is formed on which wiring 53 [53a, 53b, and 53c] by a plurality of, for example, three layers of metals M11 to M13 in this example is arranged through an interlayer insulating film 49.

In the semiconductor removed area 52 of the first semiconductor chip unit 22, the entire first semiconductor substrate 31 is removed by, for example, etching. A stacked insulating film 61 by, for example, a silicon oxide ($SiO_2$) film 58 and a silicon nitride (SiN) film 59 is formed by extending the bottom and side surface of a semiconductor removed area 52 to the surface of the semiconductor substrate. The stacked insulating film 61 is a protective insulating film which protects the semiconductor substrate 31 which is exposed in the side surface of the recess of the semiconductor removed area 52, and also serves as a reflection prevention film in pixels.

In the semiconductor removed area 52, a connection hole 64 is formed which reaches a first connection pad 65 that is electrically connected to necessary wiring of the multi-layered wiring layer 41, that is, the routing wire 40d by the metal M3 in the third layer in this example in the first semiconductor chip unit 22 from the silicon nitride film 59. In addition, a penetrating connection hole 62 is formed, which penetrates multi-layered wiring layer 41 of the first semiconductor chip unit 22 and reaches the second connection pad 63 by necessary wiring of the multi-layered wiring layer 55 in the second semiconductor chip unit 26, that is, a metal M11 in the first layer in this example. The connection pad 63 by the metal M11 in the first layer is electrically connected to a routing wire 53d by a metal M13 in the third layer via a metal M12 in the second layer.

The connection wire 67 is formed with a connection conductor 68 which is electrically connected to the first connection pad 65 buried in connection holes 64 and 62, a penetrating connection conductor 69 which is electrically connected to the second connection pad 63, and a coupling conductor 71 which electrically couples both conductors 68 and 69 at the upper ends thereof.

A light shielding film 72 which covers an area necessary for light shielding is formed on the rear face 31b serving as a light incident face of the photodiode 34 of the first semiconductor chip unit 22. Furthermore, a planarized film 73 is formed so as to cover the light shielding film 72, an on-chip color filter 74 is formed on the planarized film 73 corresponding to each pixel, and an on-chip micro-lens 75 is formed thereon so that the backside illumination type solid-state imaging device 28 is constituted. The coupling conductor 71 exposed to the outside of the connection wire 67 serves as an electrode pad for connection via an external wire and a bonding wire.

According to the solid-state imaging device 28 of the embodiment, the pixel array 23 and the control circuit 24 are formed on the first semiconductor chip unit 22, and the logic circuit 25 for signal processing is formed on the second semiconductor chip unit 26. Since the device is configured to form the functions of the pixel array and the logic circuit on different chip units and to bond the units, it is possible to use the optimum process technique for each of the pixel array 23 and the logic circuit 25. Therefore, it is possible to satisfactorily exhibit performance of each of the pixel array 23 and the logic circuit 25, and to provide a solid-state imaging device of high performance.

In the embodiment, particularly, a part of the first semiconductor chip unit 22, that is, the entire semiconductor portion of the area where the connection conductor and the penetrating connection conductor are formed is removed. Since the connection conductor 68 and the penetrating connection conductor 69 are formed in the semiconductor removed area 52 where the semiconductor portion is removed, it is possible to reduce parasitic capacity occurring between the connection conductor 68 and the penetrating connection conductor 69, and the semiconductor substrate 31, and to aim for higher performance of the solid-state imaging device.

If the configuration of the FIG. 2C is adopted, only the pixel array 23 that receives light may be formed on the first semiconductor chip unit 22, and the control circuit 24 and the logic circuit 25 can be separated and formed on the second semiconductor chip unit 26. Accordingly, it is possible to select independent and optimum process techniques for each of the semiconductor chip units 22 and 26 during the manufacturing, and to reduce the area of a product module.

In the embodiment, the first semiconductor substrate 31 including the pixel array 23 and the control circuit 24 is bonded with the second semiconductor substrate 45 including the logic circuit 25 in the half-finished states, and the first semiconductor substrate 31 is made into a thin film. In other words, the second semiconductor substrate 45 is used as a supporting substrate when the first semiconductor substrate 31 is made into a thin film. Therefore, it is possible to aim saving of members and reduction in the manufacturing process.

In the embodiment, since the first semiconductor substrate 31 is made into a thin film, and the penetrating connection hole 62 and the connection hole 64 are formed in the semiconductor removed area 52 where the semiconductor portion is removed, the aspect ratios of the holes are lowered, and the connection holes 62 and 64 can be formed with high precision. Therefore, it is possible to manufacture a solid-state imaging device of high performance with high precision.

Modified Example 1 of Configuration of Solid-State Imaging Device

Although not shown in the drawing, a modified example 1 of a connection configuration between the connection wire and the wiring of the multi-layered wiring layer in the first semiconductor chip unit and the wiring of the multi-layered wiring layer in the second semiconductor chip unit will be described. In the embodiment, the penetrating connection conductor 69 of the connection wire 67 is connected to the connection pad 63 by the metal M13 in the third layer of the multi-layered wiring layer 55 in the second semiconductor chip unit 26 side. The connection pad 63 is connected to the routing wire 53d corresponding to the vertical signal line by the metal M13 in the third layer of the same layer. Other configuration is the same as that described in FIG. 3.

Modified Example 2 of Configuration of Solid-State Imaging Device

Although not shown in the drawing, a modified example 2 of a connection configuration between the connection wire and the wiring of the multi-layered wiring layer in the first semiconductor chip unit and the wiring of the multi-layered wiring layer in the second semiconductor chip unit will be described. In the embodiment, the connection conductor 68 of the connection wire 67 is connected to the connection pad 65 by the metal M1 in the first layer of the multi-layered wiring layer 41 in the first semiconductor chip unit 22 side. When the layout of a plurality of connection wires shown in FIG. 4 to be described later is included, a routing wire corresponding to the vertical signal line connected to each of the connection pad 65 is formed by appropriately selecting one of the metal M1 to M3 in the first to third layers. On the other hand, the penetrating connection conductor 69 of the connecting wiring 67 is connected to the connection pad 63 by the metal M13 in the third layer of the multi-layered wiring layer 55 in the second semiconductor chip unit 26 side. Also in this case, a routing wire corresponding to the vertical signal line connected to each of a plurality of connection pads 63 is formed by appropriately selecting one of the metal M11 to M13 in the first to third layers. In the embodiment, it is possible to arrange a routing wire connected to a necessary connection pad to transverse another connection pad thereunder, thereby forming a fine layout of a connection wire.

Layout Example 1 of Connection Pad

Figure 4:
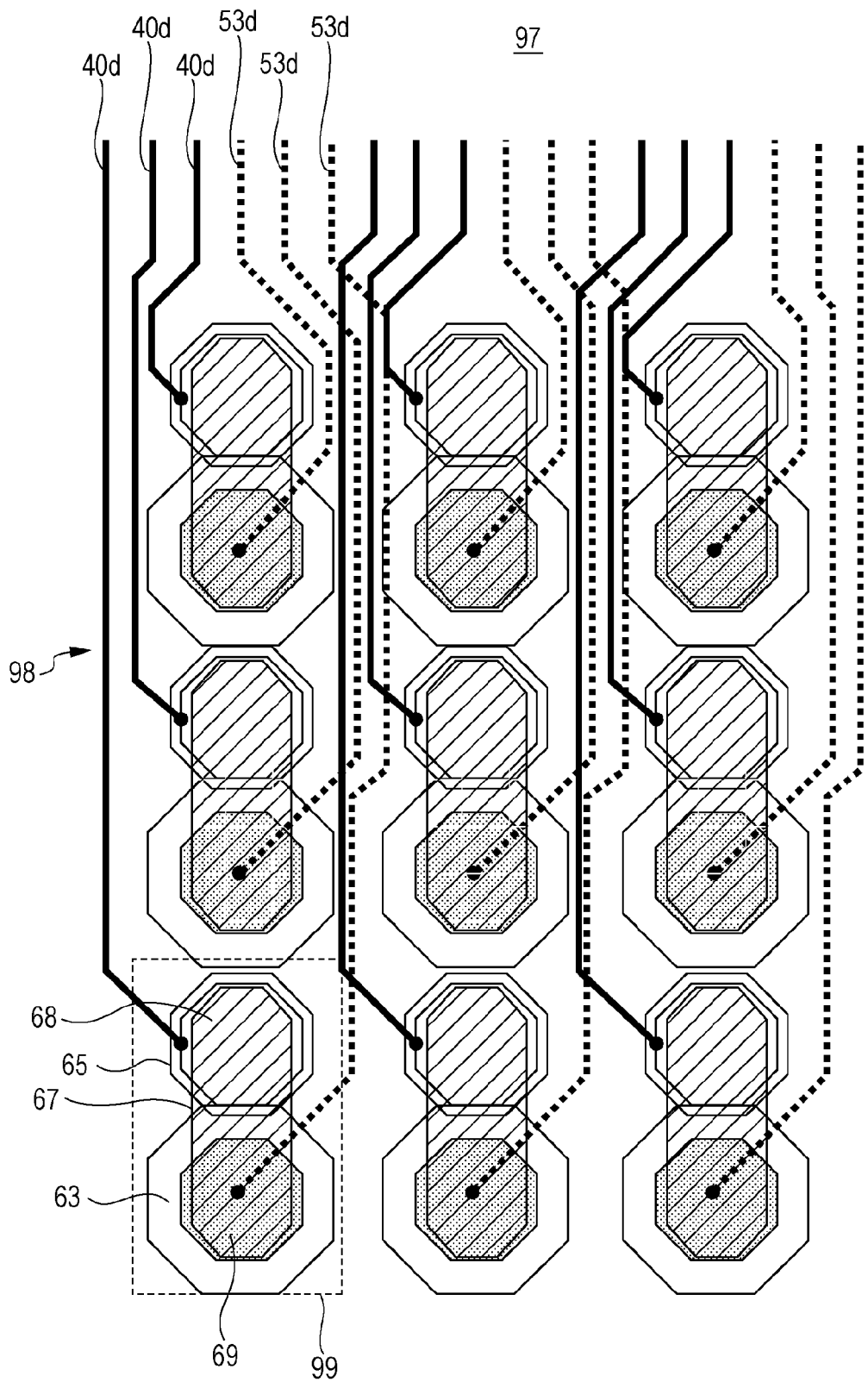
FIG. 4 is a plane diagram showing an example of the layout of a connection pad to which an embodiment of the disclosure is applied.

In FIG. 4, a layout of the connection wire connected to the routing wire corresponding to each vertical signal line of the pixel array 23 in the solid-state imaging device 27 is shown. In the embodiment, the wiring 40 of the multi-layered wiring layer 41 in the first semiconductor chip unit 22 is formed with a plurality of layers, which are three layers of metal M1 to M3 in this example. The first connection pad 65 is formed with the metal M3 in the third layer, and the routing wire corresponding to the vertical signal line is formed with the metal M3 in the third layer, or metal M2 or M1 other than the third one. The wiring 53 of the multi-layered wiring layer 55 is formed in plural layers in the second semiconductor chip unit 26, that is, formed with three layers of metals M11 to M13 in this example. The second connection pad 63 is formed with the metal M13 in the third layer, and the routing wire corresponding to the vertical signal line is formed with the metal M13 in the third layer, or metal M12 or M11 other than the third one.

The second connection pad 63 is formed with a larger area than the first connection pad 65 taking position deviation in bonding to the first and the second semiconductor chip unit 22 and 26 into consideration. The first and the second connection pads 65 and 63 making a pair together are called a connection pad pair 99.

The first and the second connection pad 65 and 63 are formed in an octagonal shape when viewed from the top, or preferably an equilateral octagon. The first and the second connection pad 65 and 63 constituting the connection pad pair 99 are arranged in the vertical direction (so-called longitudinal direction) in which the routing wires 40d and 53d corresponding to the vertical signal lines extend. The connection pad pair 99 is arranged in plural along the horizontal direction in which the routing wires 40d and 53d are arranged, and arranged with a plurality of stages in the vertical direction, which is a three-stage arrangement in this example, to form a connection pad array 98.

Other layout of the routing wires corresponding to the vertical signal lines connected to the connection pad pair 99 will be described. In the example of FIG. 4 described above, in the both sides of the connection pad pair arranged in three stages, it is configured that the routing wire 40d (solid line) connected to the first connection pad 65 and the routing wire 53d (dotted line) connected to the second connection pad 63 are arranged respectively. Not showing in the drawing, it can be configured that the routing wire 40d (solid line) connected to the first connection pad 65 and the routing wire 53d (dotted line) connected to the second connection pad 63 are arranged in a single side of the connection pad pair 99 arranged in three stages.

Furthermore, it is also possible to form the wiring of the multi-layered wiring layers 41 and 55 in the first semiconductor chip unit 22 and the second semiconductor chip unit 26 include a plurality of metal layers, for example, four metal layers other than three metal layers. In this case, it is preferable that the connection pad and the routing wire be formed with metals in separate layers so that the routing wire is routed so as to be overlap with the connection pad.

In addition, when the wiring 53 of the multi-layered wiring layer 55 in the second semiconductor chip unit 26 is configured to be, for example, metal in four layers, it is preferable that the second connection pad 63 be formed with a metal in the fourth layer, and routing wire 53d connected to the connection pad 63 be formed with the metal in the first layer. In this case, it is possible to arrange the routing wire to be overlap with the second connection pad 63. Furthermore, it is not limited to the example, and the second connection pad 63 and the routing wire 53d can be formed with a metal in any layer.

3. First Embodiment

Configuration Example of Solid-State Imaging Device

Figure 5A:
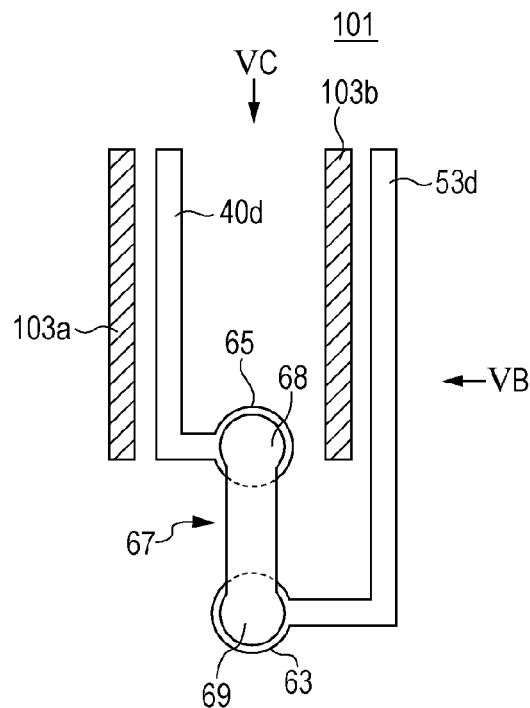
FIGS. 5A, 5B, and 5C are a plane diagram of principal portions showing a first embodiment of the solid-state imaging device according to the disclosure, a cross-sectional diagram viewed from the direction of the arrow VB of FIG. 5A, and a cross-sectional diagram viewed from the direction of the arrow VC of FIG. 5A.
Figure 5B:
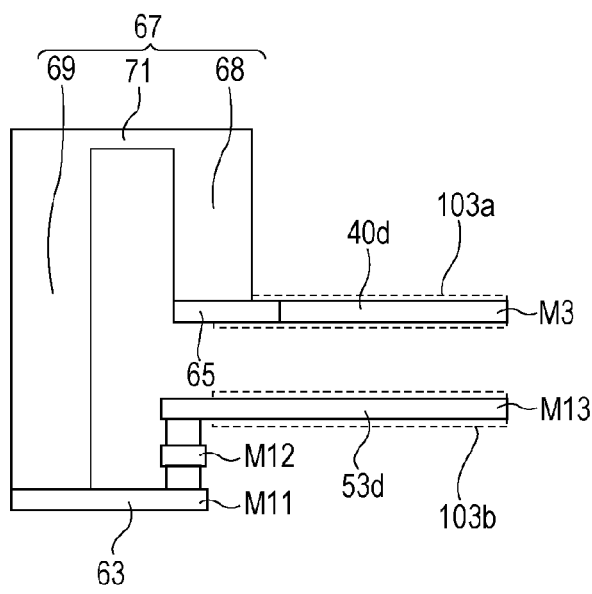
Figure 5C:
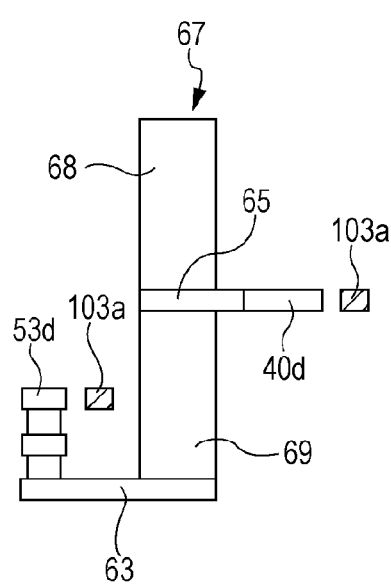

In FIGS. 5A to 5C, a solid-state imaging device according to the disclosure, that is, a first embodiment of the MOS solid-state imaging device is shown. Particularly in the drawing, a connection wire which electrically connects the first and the second semiconductor chip units, routing wires corresponding to vertical signal lines connected thereto, and shield wiring portions are shown. FIG. 5A is a plane view, FIG. 5B is a cross-sectional view as viewed in the arrow VB direction of FIG. 5A, and FIG. 5C is a cross-sectional view as viewed in the arrow VC direction of FIG. 5A. Since the configuration of the embodiment shown in FIGS. 3 and 4 described above can be applied to other configuration thereof, portions in FIGS. 5A to 5C corresponding to those in FIGS. 3 and 4 are given the same reference numerals and detailed description thereof will be omitted.

A solid-state imaging device 101 according to the first embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire 67 is arranged in plural in the horizontal direction, and not shown in the drawing, arranged in plural stages in the vertical direction, and the connection conductor 68 and the penetrating connection conductor 69 in each connection wire 67 are respectively connected to routing wires 40d and 53d corresponding to vertical signal lines.

In this example, the connection wire 68 is connected to the routing wire 40d corresponding to a vertical signal line through the first connection pad 65 connected thereto in the multi-layered wiring layer 41 in the first semiconductor chip unit 22. The first connection pad 65 and the routing wire 40d connected thereto are formed with the metal M3 in the same third layer. In addition, the penetrating connection conductor 69 is connected to the routing wire 53d corresponding to a vertical signal line through the second connection pad 63 connected thereto in the multi-layered wiring layer 55 in the second semiconductor chip unit 26. The second connection pad 63 is formed with the metal M11 in the first layer, and the routing wire 53d connected thereto is formed with the metal M13 in the third layer. The second connection pad 63 is connected to the routing wire 53d of the metal M13 in the third layer through the metal M12 in the second layer.

In the embodiment, it is configured to include shield wires 103 [103a and 103b] which shield the gap between the connection wire 67 and the routing wires 40d and 53d corresponding to vertical signal lines connected to another connection wire 67 adjacent to the connection wire 67. In other words, there is arranged the shield wire 103a which shields the gap between the connection conductor 68 of the connection wire 67 and the routing wire 40d connected to another connection conductor 68 adjacent to the connection conductor 68. At the same time, there is arranged the shield wire 103b which shields the gap between the penetrating connection conductor 69 of the connection wire 67 and the routing wire 53d connected to another penetrating connection conductor 69 adjacent to the penetrating connection conductor 69.

The shield wire 103a and 103b are formed with necessary wiring metals in layers in the first multi-layered wiring layer 41 and the second multi-layered wiring layer 55 in the first semiconductor chip unit 22 and the second semiconductor chip unit 26. The shield wire 103a is in parallel with the routing wire 40d connected to the connection conductor 68, and is formed with the metal M3 in the same third layer as the metal M3 in the third layer which serves as the routing wire 40d so that the shield wire extends to the position corresponding to the connection conductor 68. The shield wire 103b is in parallel with the routing wire 53d connected to the penetrating connection conductor 69, and is formed with the metal M13 in the same third layer as the metal M13 in the third layer which serves as the routing wire 53d so that the shield wire extends to the position corresponding to the penetrating connection conductor 69. The length of the shield wires 103 [103a and 103b] is set according to the pattern of the routing wires 40d and 53d. The shield wires 103a and 103b are arranged in the same sides of the routing wires 40d and 53d corresponding thereto. In FIG. 5A, the shield wires 103a and 103b are arranged in the right sides thereof.

According to the solid-state imaging device 101 according to the first embodiment, the shield wires 103a and 103b are formed, which are in parallel with the routing wires 40d and 53d connected to the connection conductor 68 and the penetrating connection conductor 69 of each connection wire 67 and extend to the connection conductor 68 and the penetrating connection conductor 69. In this case, the two shield wires 103a and 103b are arranged between one connection wire 67 and the routing wires connected to another connection wire 67 adjacent thereto. Accordingly, it is possible to suppress adjacent coupling capacity between the one connection wire 67 and the routing wires 40d and 53d connected to another connection wire 67 adjacent thereto. Since the shield wires 103a and 103b are formed with the metal M3 and M13 in different layers, it is possible to easily reduce three-dimensional adjacent coupling capacity. Therefore, it is possible to provide a solid-state imaging device with high performance. The shield wires 103 [103a and 103b] are formed using wiring metal constituting the multi-layered wiring layers 41 and 55. For this reason, since the shield wires 103a and 103b are formed in a process performed simultaneously with the pattern process of wiring of the multi-layered wiring layers 41 and 55, it is possible to manufacture the solid-state imaging device 101 of the embodiment with a simple configuration and without increasing the number of manufacturing processes.

Since the surface of the multi-layered wiring layers 41 and 55 becomes more even plane with the formation of the shield wires 103a and 103b, the silicon substrate of the first semiconductor chip unit 22 is made into a thin file by, for example, CMP (Chemical Mechanical Polishing), or the like, thereby stabilizing the shape.

4. Second Embodiment

Configuration Example of Solid-State Imaging Device

Figure 6A:
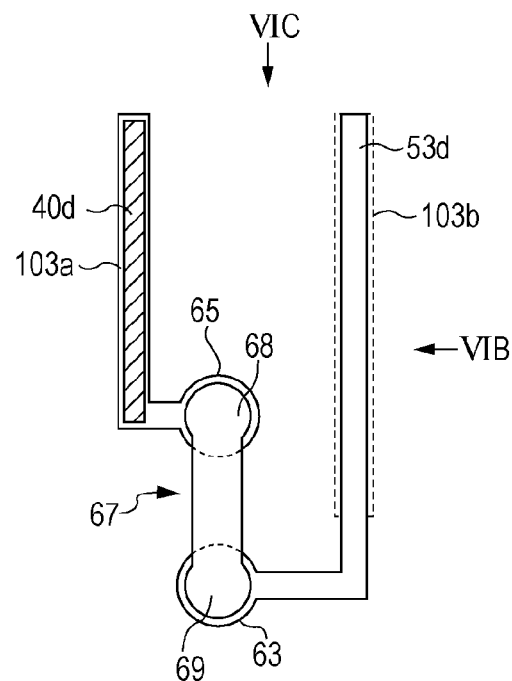
FIGS. 6A, 6B, and 6C are a plane diagram of principal portions showing a second embodiment of the solid-state imaging device according to the disclosure, a cross-sectional diagram viewed from the direction of the arrow VIB of FIG. 6A, and a cross-sectional diagram viewed from the direction of the arrow VIC of FIG. 6A.
Figure 6B:
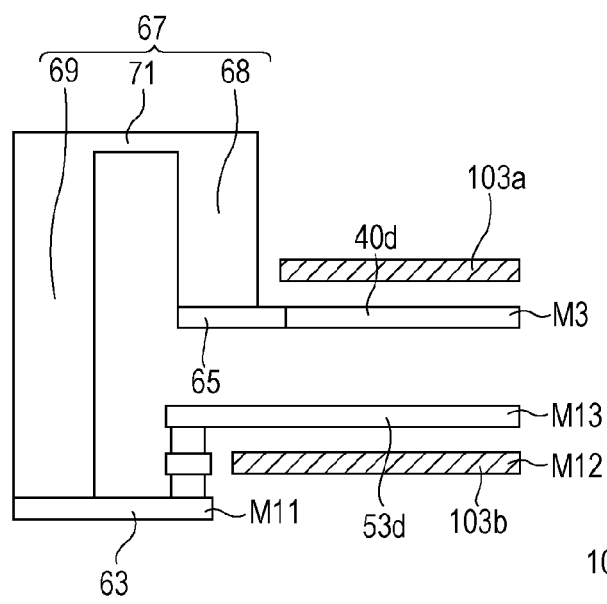
Figure 6C:
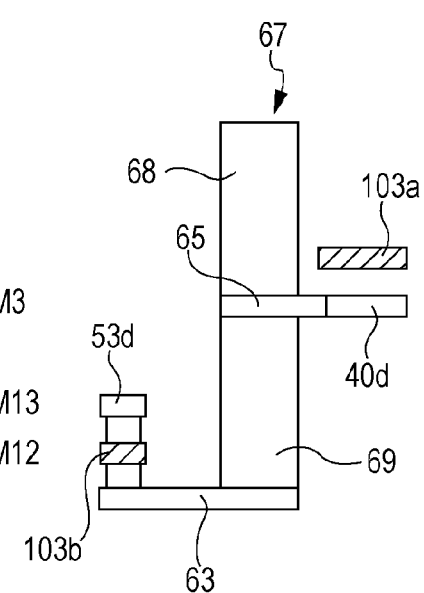

In FIGS. 6A to 6C, a solid-state imaging device according to the disclosure, that is, a second embodiment of the MOS solid-state imaging device is shown. Particularly in the drawing, a connection wire which electrically connects the first and the second semiconductor chip units, routing wires corresponding to vertical signal lines connected thereto, and shield wiring portions are shown. FIG. 6A is a plane view, FIG. 6B is a cross-sectional view as viewed in the arrow VIB direction of FIG. 6A, and FIG. 6C is a cross-sectional view as viewed in the arrow VIC direction of FIG. 6A. Since the configuration of the embodiment shown in FIGS. 3 and 4 described above can be applied to other configuration thereof, portions in FIGS. 6A to 6C corresponding to those in FIGS. 3 and 4 are given the same reference numerals and detailed description thereof will be omitted.

A solid-state imaging device 105 according to the second embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69, in the same manner as described above. The connection wire 67 is arranged in plural in the horizontal direction, and not shown in the drawing, arranged in plural stages in the vertical direction, and the connection conductor 68 and the penetrating connection conductor 69 in each connection wire 67 are respectively connected to the routing wires 40d and 53d corresponding to vertical signal lines.

In this example, the connection wire 68 is connected to the routing wire 40d corresponding to a vertical signal line through the first connection pad 65 connected thereto in the multi-layered wiring layer 41 in the first semiconductor chip unit 22. The first connection pad 65 and the routing wire 40d connected thereto are formed with the metal M3 in the same third layer. In addition, the penetrating connection conductor 69 is connected to the routing wire 53d corresponding to a vertical signal line through the second connection pad 63 connected thereto in the multi-layered wiring layer 55 in the second semiconductor chip unit 26. The second connection pad 63 is formed with the metal M11 in the first layer, and the routing wire 53d connected thereto is formed with the metal M13 in the third layer. The second connection pad 63 is connected to the routing wire 53d of the metal M13 in the third layer through the metal M12 in the second layer.

In the embodiment, it is configured to include the shield wires 103 [103a and 103b] which shield the gap between the connection wire 67 and the routing wires 40d and 53d corresponding to vertical signal lines connected to another connection wire 67 adjacent to the connection wire 67. In other words, there is arranged the shield wire 103a which shields the gap between the connection conductor 68 of the connection wire 67 and the routing wire 40d connected to another connection conductor 68 adjacent to the connection conductor 68. At the same time, there is arranged the shield wire 103b which shields the gap between the penetrating connection conductor 69 of the connection wire 67 and the routing wire 53d connected to another penetrating connection conductor 69 adjacent to the penetrating connection conductor 69.

The shield wire 103a and 103b are formed with necessary wiring metals in layers in the first multi-layered wiring layer 41 and the second multi-layered wiring layer 55 in the first semiconductor chip unit 22 and the second semiconductor chip unit 26. The shield wire 103a is in parallel with the routing wire 40d connected to the connection conductor 68, and is formed with the metal M2 in second layer different from the metal M3 in the third layer which serves as the routing wire 40d so that the shield wire extends to the position corresponding to the connection conductor 68. The shield wire 103b is in parallel with the routing wire 53d connected to the penetrating connection conductor 69, and is formed with the metal M12 in the second layer different form the metal M13 in the third layer which serves as the routing wire 53d so that the shield wire extends to the position corresponding to the penetrating connection conductor 69.

According to the solid-state imaging device 105 according to the second embodiment, the shield wires 103a and 103b are formed, each of which overlaps the routing wires 40d and 53d connected to the connection conductor 68 and the penetrating connection conductor 69 of each connection wire 67 and extends to the connection conductor 68 and the penetrating connection conductor 69. Accordingly, the two shield wires 103a and 103b are arranged between one connection wire 67 and the routing wires connected to another connection wire 67 adjacent thereto. Accordingly, it is possible to suppress adjacent coupling capacity between the one connection wire 67 and the routing wires 40d and 53d connected to another connection wire 67 adjacent thereto. Since the shield wires 103a and 103b are formed with metals in different layers, it is possible to easily reduce three-dimensional adjacent coupling capacity. Therefore, it is possible to provide a solid-state imaging device with high performance. The shield wires 103a and 103b are formed using wiring metal constituting the multi-layered wiring layers 41 and 55. For this reason, since the shield wires 103a and 103b are formed in a process performed simultaneously with the pattern process of wiring of the multi-layered wiring layers 41 and 55, it is possible to manufacture the solid-state imaging device 105 of the embodiment with a simple configuration and without increasing the number of manufacturing processes.

Since the surface of the multi-layered wiring layers 41 and 55 becomes more even plane with the formation of the shield wires 103a and 103b, the silicon substrate of the first semiconductor chip unit 22 is made into a thin file by, for example, CMP (Chemical Mechanical Polishing), or the like, thereby stabilizing the shape.

5. Third Embodiment

Configuration Example of Solid-State Imaging Device

Figure 7A:
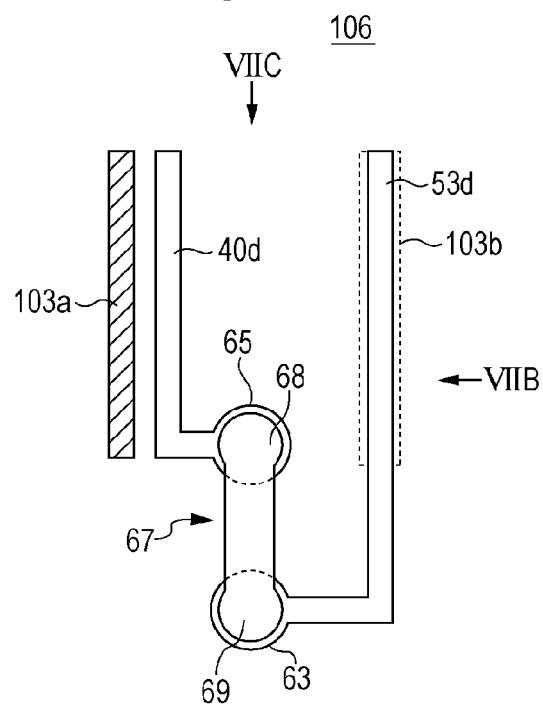
FIGS. 7A, 7B, and 7C are a plane diagram of principal portions showing a third embodiment of the solid-state imaging device according to the disclosure, a cross-sectional diagram viewed from the direction of the arrow VIIB of FIG. 7A, and a cross-sectional diagram viewed from the direction of the arrow VIIC of FIG. 7A.
Figure 7B:
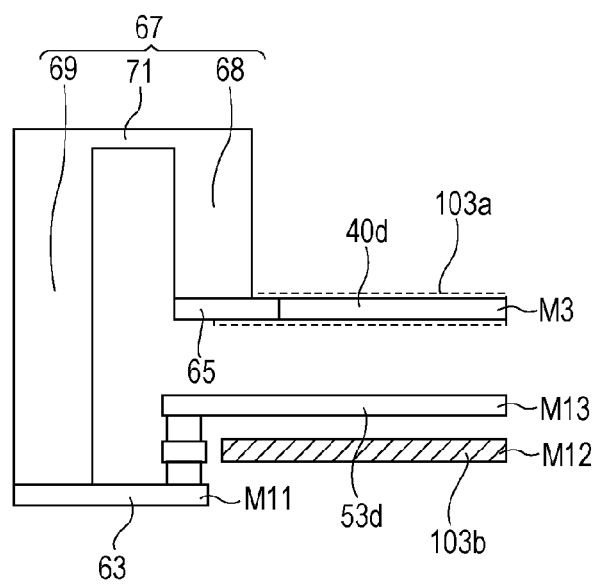
Figure 7C:
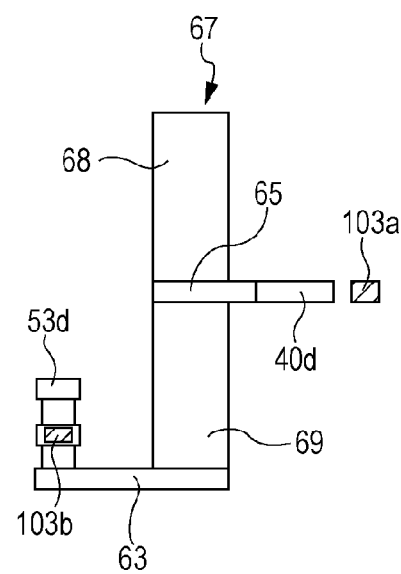

In FIGS. 7A to 7C, a solid-state imaging device according to the disclosure, that is, a third embodiment of the MOS solid-state imaging device is shown. Particularly in the drawing, a connection wire which electrically connects the first and the second semiconductor chip units, routing wires corresponding to vertical signal lines connected thereto, and shield wiring portions are shown. FIG. 7A is a plane view, FIG. 7B is a cross-sectional view as viewed in the arrow VIIB direction of FIG. 7A, and FIG. 7C is a cross-sectional view as viewed in the arrow VIIC direction of FIG. 7A. Since the configuration of the embodiment shown in FIGS. 3 and 4 described above can be applied to other configuration thereof, portions in FIGS. 7A to 7C corresponding to those in FIGS. 3 and 4 are given the same reference numerals and detailed description thereof will be omitted.

A solid-state imaging device 106 according to the third embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69, in the same manner as described above. The connection wire 67 is arranged in plural in the horizontal direction, and not shown in the drawing, arranged in plural stages in the vertical direction, and the connection conductor 68 and the penetrating connection conductor 69 in each connection wire 67 are respectively connected to the routing wires 40d and 53d corresponding to vertical signal lines.

In this example, the connection wire 68 is connected to the routing wire 40d corresponding to a vertical signal line through the first connection pad 65 connected thereto in the multi-layered wiring layer 41 in the first semiconductor chip unit 22. The first connection pad 65 and the routing wire 40d connected thereto are formed with the metal M3 in the same third layer. In addition, the penetrating connection conductor 69 is connected to the routing wire 53d corresponding to a vertical signal line through the second connection pad 63 connected thereto in the multi-layered wiring layer 55 in the second semiconductor chip unit 26. The second connection pad 63 is formed with the metal M13 in the third layer, and the routing wire 53d connected thereto is formed with the metal M11 in the first layer. The second connection pad 63 is connected to the routing wire 53d of the metal M11 in the first layer through the metal M12 in the second layer.

In the embodiment, it is configured to include the shield wires 103 [103a and 103b] which shield the gap between the connection wire 67 and the routing wires 40d and 53d corresponding to vertical signal lines connected to another connection wire 67 adjacent to the connection wire 67. In other words, there is arranged the shield wire 103a which shields the gap between the connection conductor 68 of the connection wire 67 and the routing wire 40d connected to another connection conductor 68 adjacent to the connection conductor 68. At the same time, there is arranged the shield wire 103b which shields the gap between the penetrating connection conductor 69 of the connection wire 67 and the routing wire 53d connected to another penetrating connection conductor 69 adjacent to the penetrating connection conductor 69.

The shield wire 103a and 103b are formed with necessary wiring metals in layers in the first multi-layered wiring layer 41 and the second multi-layered wiring layer 55 in the first semiconductor chip unit 22 and the second semiconductor chip unit 26. The shield wire 103a is in parallel with the routing wire 40d connected to the connection conductor 68, and is formed with the same metal M3 in third layer as the metal M3 in the third layer which serves as the routing wire 40d so that the shield wire extends to the position corresponding to the connection conductor 68. The shield wire 103b overlaps the routing wire 53d connected to the penetrating connection conductor 69, and is formed with the metal M12 in the second layer different form the metal M13 in the third layer which serves as the routing wire 53d so that the shield wire extends to the position corresponding to the penetrating connection conductor 69.

According to the solid-state imaging device 106 according to the third embodiment, the shield wire 103a is formed so that the shield wire is in parallel with the routing wires 40d connected to the connection conductor 68 of the connection wire 67 and extends to the connection conductor 68. In addition, the shield wire 103b by a metal in a different layer from the routing wire 53b is formed so that the shield wire overlaps the routing wire 53d connected to the penetrating connection conductor 69 and extends to the penetrating connection conductor 69. Accordingly, the two shield wires 103a and 103b are arranged substantially between one connection wire 67 and the routing wires 40d and 53d connected to another connection wire 67 adjacent thereto. Accordingly, it is possible to suppress adjacent coupling capacity between the one connection wire 67 and the routing wires 40d and 53d connected to another connection wire 67 adjacent thereto. Since the shield wires 103a and 103b are formed with metals in different layers, it is possible to easily reduce three-dimensional adjacent coupling capacity. Therefore, it is possible to provide a solid-state imaging device with high performance. The shield wires 103a and 103b are formed using wiring metal constituting the multi-layered wiring layers 41 and 55. For this reason, since the shield wires 103a and 103b are formed in a process performed simultaneously with the pattern process of wiring of the multi-layered wiring layers 41 and 55, it is possible to manufacture the solid-state imaging device 106 of the embodiment without increasing the number of manufacturing processes.

Since the surface of the multi-layered wiring layers 41 and 55 becomes more even plane with the formation of the shield wires 103a and 103b, the silicon substrate of the first semiconductor chip unit 22 is made into a thin file by, for example, CMP (Chemical Mechanical Polishing), or the like, thereby stabilizing the shape.

Modified Example

It can be also configured that the relationship between the routing wire 40d and the shield wire 103a the routing wire 53d and the shield wire 103b of FIGS. 7A to 7C are reversed. In other words, the connection pad 65 connected to the connection conductor 68 is formed with the metal M3 in the third layer, the routing wire 40d connected to the connection pad 65 is formed with the metal M2 in the second layer, and the shield wire 103a is formed with the metal M3 in the third layer or M1 in the first layer so as to overlap the routing wire 40d. In addition, the routing wire 53d connected to the penetrating connection conductor 69 through the connection pad 63 is formed with the metal M13 in the third layer, and the shield wire 103b is formed with the metal M13 in the third layer so as to be in parallel with the routing wire 53d.

The same effect as described in the third embodiment is exhibited also in the above configuration.

6. Fourth Embodiment

Configuration Example of Solid-State Imaging Device

Figure 8A:
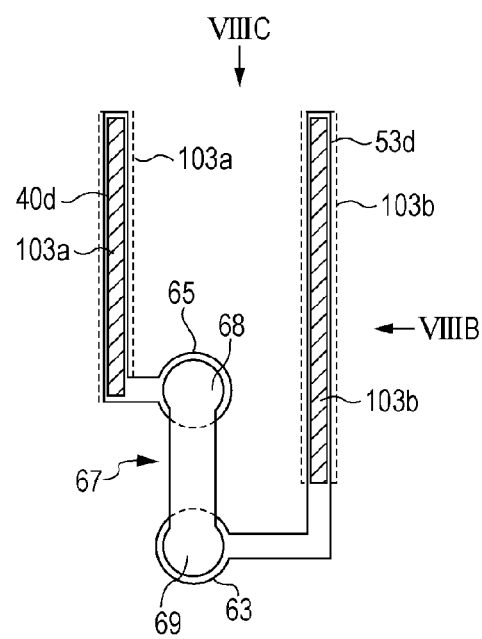
FIGS. 8A, 8B, and 8C are a plane diagram of principal portions showing a fourth embodiment of the solid-state imaging device according to the disclosure, a cross-sectional diagram viewed from the direction of the arrow VIIIB of FIG. 8A, and a cross-sectional diagram viewed from the direction of the arrow VIIIC of FIG. 8A.
Figure 8B:
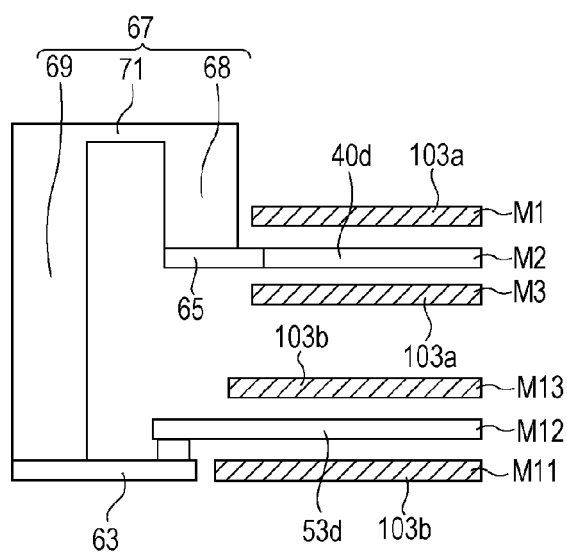
Figure 8C:
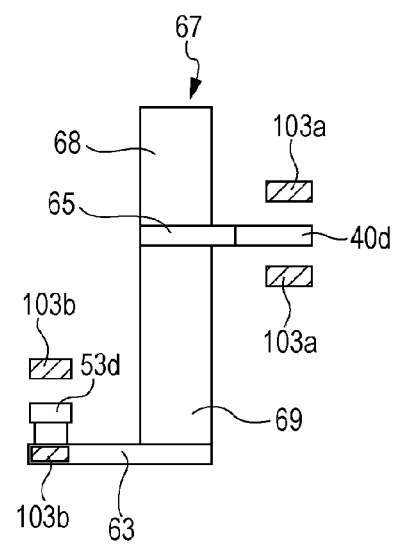

In FIGS. 8A to 8C, a solid-state imaging device according to the disclosure, that is, a fourth embodiment of the MOS solid-state imaging device is shown. Particularly in the drawing, a connection wire which electrically connects the first and the second semiconductor chip units, routing wires corresponding to vertical signal lines connected thereto, and shield wiring portions are shown. FIG. 8A is a plane view, FIG. 8B is a cross-sectional view as viewed in the arrow VIIIB direction of FIG. 8A, and FIG. 8C is a cross-sectional view as viewed in the arrow VIIIC direction of FIG. 8A. Since the configuration of the embodiment shown in FIGS. 3 and 4 described above can be applied to other configuration thereof, portions in FIGS. 8A to 8C corresponding to those in FIGS. 3 and 4 are given the same reference numerals and detailed description thereof will be omitted.

A solid-state imaging device 107 according to the fourth embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69, in the same manner as described above. The connection wire 67 is arranged in plural in the horizontal direction, and not shown in the drawing, arranged in plural stages in the vertical direction, and the connection conductor 68 and the penetrating connection conductor 69 in each connection wire 67 are respectively connected to the routing wires 40d and 53d corresponding to vertical signal lines.

In this example, the connection wire 68 is connected to the routing wire 40d corresponding to a vertical signal line through the first connection pad 65 connected thereto in the multi-layered wiring layer 41 in the first semiconductor chip unit 22. The first connection pad 65 and the routing wire 40d connected thereto are formed with the metal M2 in the same second layer. In addition, the penetrating connection conductor 69 is connected to the routing wire 53d corresponding to a vertical signal line through the second connection pad 63 connected thereto in the multi-layered wiring layer 55 in the second semiconductor chip unit 26. The second connection pad 63 and the routing wire 53d connected thereto are formed with the metal M12 in the second layer.

In the embodiment, it is configured to include the shield wires 103 [103a and 103b] which shield the gap between the connection wire 67 and the routing wires 40d and 53d corresponding to vertical signal lines connected to another connection wire 67 adjacent to the connection wire 67. In other words, there is arranged the shield wire 103a which shields the gap between the connection conductor 68 of the connection wire 67 and the routing wire 40d connected to another connection conductor 68 adjacent to the connection conductor 68. At the same time, there is arranged the shield wire 103b which shields the gap between the penetrating connection conductor 69 of the connection wire 67 and the routing wire 53d connected to another penetrating connection conductor 69 adjacent to the penetrating connection conductor 69.

The shield wires 103a are constituted by two shield wires by the metal M1 in the first layer and the metal M3 in the third layer so that the shield wires interpose the routing wire 40d connected to the connection conductor 68 in the multi-layered wiring layer 41 of the first semiconductor chip unit 22 in the upper and lower sides and extend to the connection conductor 68. The shield wires 103b are constituted by two shield wires by the metal M11 in the first layer and the metal M13 in the third layer so that the shield wires interpose the routing wire 53d connected to the penetrating connection conductor 69 in the multi-layered wiring layer 55 of the second semiconductor chip unit 26 in the upper and lower sides and extend to the penetrating connection conductor 69.

According to the solid-state imaging device 107 according to the fourth embodiment, the routing wires 40d and 53d connected to the connection conductor 68 and the penetrating connection conductor 69 respectively are formed by being interposed by two pairs of the shield wires 103a and 103b in the upper and lower sides. Accordingly, the two pairs of the shield wires 103a and 103b are arranged substantially between one connection wire 67 and the routing wires 40d and 53d connected to another connection wire 67 adjacent thereto. Accordingly, it is possible to suppress adjacent coupling capacity between the one connection wire 67 and the routing wires 40d and 53d connected to another connection wire 67 adjacent thereto. Since the shield wires 103a and 103b are formed with metals in different layers, it is possible to easily reduce three-dimensional adjacent coupling capacity. Therefore, it is possible to provide a solid-state imaging device with high performance. The shield wires 103a and 103b are formed using wiring metal constituting the multi-layered wiring layers 41 and 55. For this reason, since the shield wires 103a and 103b are formed in a process performed simultaneously with the pattern process of wiring of the multi-layered wiring layers 41 and 55, it is possible to manufacture the solid-state imaging device 107 of the embodiment without increasing the number of manufacturing processes.

Since the surface of the multi-layered wiring layers 41 and 55 becomes more even plane with the formation of the shield wires 103a and 103b, the silicon substrate of the first semiconductor chip unit 22 is made into a thin file by, for example, CMP (Chemical Mechanical Polishing), or the like, thereby stabilizing the shape.

7. Fifth Embodiment

Configuration Example of Solid-State Imaging Device

In FIG. 9, a solid-state imaging device according to the disclosure, that is, a fifth embodiment of a backside illumination type MOS solid-state imaging device is shown. Particularly in the drawing, a connection wire array in which a plurality of connection wires which electrically connects the first and the second semiconductor chip units is arranged and a shield wire portion between adjacent connection wires are shown. Since the configuration of the embodiment shown in FIGS. 3 and 4 described above can be applied to other configuration thereof, portions in FIG. 9 corresponding to those in FIGS. 3 and 4 are given the same reference numerals, and detailed description thereof will be omitted.

A solid-state imaging device 111 according to the fifth embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire array 109 is constituted by a plurality of the connection wires 67. For the connection wire array 109, connection wire groups 110 in which the connection wires 67 are arranged in plural stages in the vertical direction, that is, arranged in three stages in this example are arranged in plural columns in the horizontal direction, that is, arranged in four columns in the example. The connection conductor 68 and the penetrating connection conductor 69 in each connection wire 67 are connected each to the routing wires 40d and 53d (not shown in the drawing) corresponding to the vertical signal lines. In the drawing, the routing wires 40d and 53d are omitted, but the routing wires 40d and 53d are connected in the same pattern as in FIG. 4 described above. The routing wires 40d and 53d are formed extending in the arrow y direction.

In this example, in the connection wire array 109, the connection wire groups 110 corresponding to each column are divided by continuous shield wires 113 when viewed from the top. The shield wires 113 include a shield wire portion 113a arranged between adjacent connection wire groups 110 so as to interpose each of the connection wire groups 110 in the both sides, and a shield wire portion 113b which connects the shield wire portion 113a to the end of the extension side of the routing wire. In other words, the shield wires 113 are formed in a pectinate pattern so as to close the extension side of the routing wires 40d and 53d.

The shield wires 113 can be formed, for example, with a metal in a necessary layer in the multi-layered wiring layer 41 of the first semiconductor chip unit 22 side. Alternatively, the shield wires 113 can be formed with a metal in a necessary layer in the multi-layered wiring layer 55 of the second semiconductor chip unit 26 side. Alternatively, the shield wires 113 can be formed with a metal in the necessary layer of each of the multi-layered wiring layers 41 and 55 in the first and the second semiconductor chip units 22 and 26. In this case, the shield wires 113 of the pectinate pattern are formed with the necessary metal in the multi-layered wiring layer 41, and the shield wires 113 of the pectinate pattern are formed with the necessary metal in the multi-layered wiring layer 55. The shield wires 113 are given a ground potential.

According to the solid-state imaging device 111 according to the fifth embodiment, since each of the connection wire groups 110 is surrounded by the shield wires 113 of the pectinate pattern which open the opposite side to the extension side of the routing wires in the connection wire array 109, adjacent connection wire groups 110 are shielded. For this reason, it is possible to suppress adjacent coupling capacity occurring between the adjacent connection wire groups 110. When the shield wires 113 in the pectinate pattern are formed with the metal in the multi-layered wiring layers 41 and 55, it is possible to easily reduce three-dimensional adjacent coupling capacity. Therefore, it is possible to provide a solid-state imaging device with high performance. The shield wires 113 are formed using metals constituting the multi-layered wiring layer 41 and/or 55. For this reason, since the shield wires are formed in a process performed simultaneously with the pattern process of wiring of the multi-layered wiring layers 41 and 55, it is possible to manufacture the solid-state imaging device 111 of the embodiment without increasing the number of manufacturing processes.

Since the surface of the multi-layered wiring layers 41 and 55 becomes more even plane with the formation of the shield wires 113, the silicon substrate of the first semiconductor chip unit 22 is made into a thin file by, for example, CMP (Chemical Mechanical Polishing), or the like, thereby stabilizing the shape.

8. Sixth Embodiment

Configuration Example of Solid-State Imaging Device

Figure 10:
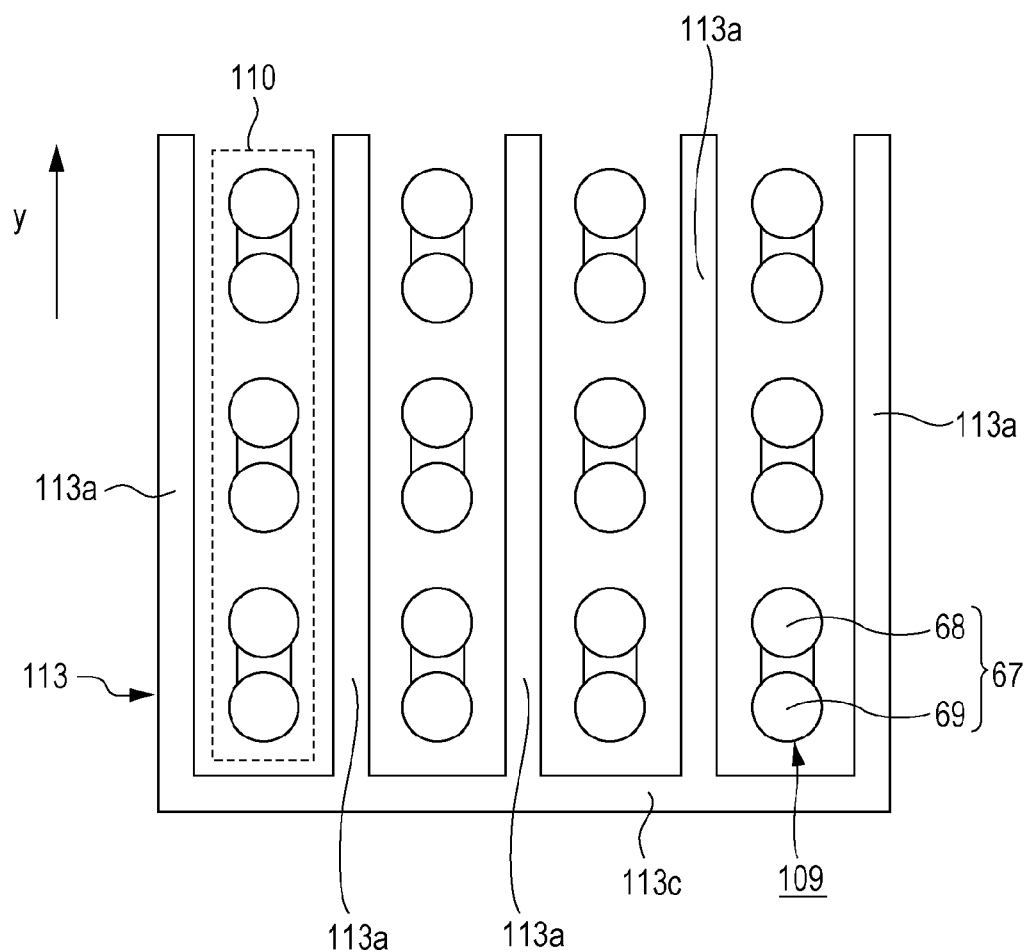
FIG. 10 is a plane diagram of principal portions showing a sixth embodiment of the solid-state imaging device according to the disclosure.

In FIG. 10, a solid-state imaging device according to the disclosure, that is, a sixth embodiment of a backside illumination type MOS solid-state imaging device is shown. Particularly in the drawing, a connection wire array in which a plurality of connection wires which electrically connects the first and the second semiconductor chip units is arranged and a shield wire portion between adjacent connection wires are shown. Since the configuration of the embodiment shown in FIGS. 3 and 4 described above can be applied to other configuration thereof, portions in FIG. 10 corresponding to those in FIGS. 3 and 4 are given the same reference numerals, and detailed description thereof will be omitted.

A solid-state imaging device 112 according to the sixth embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire array 109 is constituted by a plurality of the connection wires 67. For the connection wire array 109, connection wire groups 110 in which the connection wires 67 are arranged in plural stages in the vertical direction, that is, arranged in three stages in this example are arranged in plural columns in the horizontal direction, that is, arranged in four columns in the example. The connection conductor 68 and the penetrating connection conductor 69 in each connection wire 67 are connected each to the routing wires 40d and 53d (not shown in the drawing) corresponding to the vertical signal lines. In the drawing, the routing wires 40d and 53d are omitted, but the routing wires 40d and 53d are connected in the same pattern as in FIG. 4 described above. The routing wires 40d and 53d are formed extending in the arrow y direction.

In this example, in the connection wire array 109, the connection wire groups 110 corresponding to each column are divided by continuous shield wires 113 when viewed from the top. The shield wires 113 are formed in a pectinate pattern which is formed by turning the pectinate pattern in the above-described fifth embodiment upside down. In other words, the shield wires 113 include a shield wire portion 113a arranged between adjacent connection wire groups 110 so as to interpose each of the connection wire groups 110 in the both sides, and a shield wire portion 113c which connects the shield wire portion 113a to the ends of the opposite side to the extension side of the routing wires. Accordingly, the shield wires 113 are formed in a pectinate pattern so as to open the extension side of the routing wires.

The shield wires 113 can be formed, for example, with a metal in a necessary layer in the multi-layered wiring layer 41 of the first semiconductor chip unit 22 side. Alternatively, the shield wires 113 can be formed with a metal in a necessary layer in the multi-layered wiring layer 55 of the second semiconductor chip unit 26 side. Alternatively, the shield wires 113 can be formed with a metal in the necessary layer of each of the multi-layered wiring layers 41 and 55 in the first and the second semiconductor chip units 22 and 26. In this case, the shield wires 113 of the pectinate pattern are formed with the necessary metal in the multi-layered wiring layer 41, and the shield wires 113 of the pectinate pattern are formed with the necessary metal in the multi-layered wiring layer 55. The shield wires 113 are given a ground potential.

According to the solid-state imaging device 112 according to the sixth embodiment, since each of the connection wire groups 110 is surrounded by the shield wires 113 of the pectinate pattern, with which the extension side of the routing wires are open in the connection wire array 109, adjacent connection wire groups 110 are shielded. For this reason, it is possible to suppress adjacent coupling capacity occurring between the adjacent connection wire groups 110. When the shield wires 113 in the pectinate pattern are formed with the metal in the multi-layered wiring layers 41 and 55, it is possible to easily reduce three-dimensional adjacent coupling capacity. Therefore, it is possible to provide a solid-state imaging device with high performance. The shield wires 113 are formed using metals constituting the multi-layered wiring layer 41 and/or 55. For this reason, since the shield wires are formed in a process performed simultaneously with the pattern process of wiring of the multi-layered wiring layers 41 and 55, it is possible to manufacture the solid-state imaging device 112 of the embodiment without increasing the number of manufacturing processes.

9. Seventh Embodiment

Configuration Example of Solid-State Imaging Device

Figure 11:
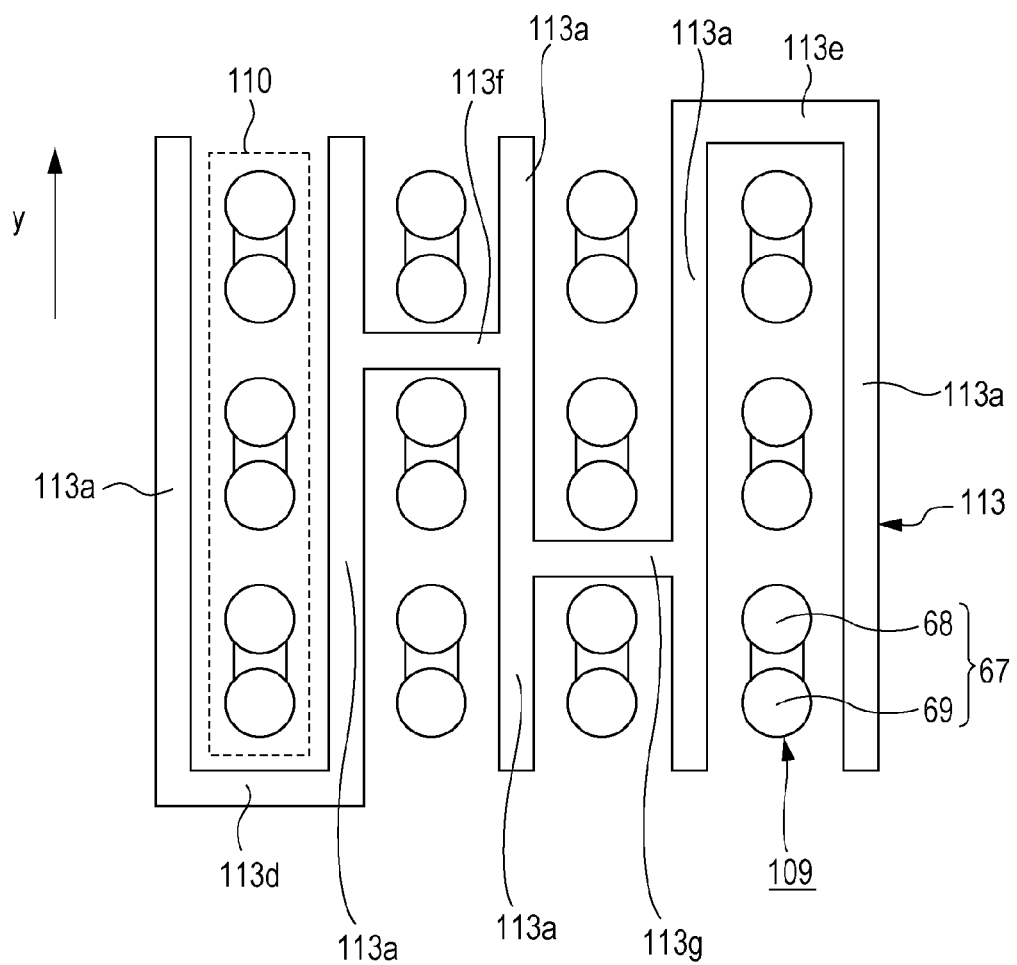
FIG. 11 is a plane diagram of principal portions showing a seventh embodiment of the solid-state imaging device according to the disclosure.

In FIG. 11, a solid-state imaging device according to the disclosure, that is, a seventh embodiment of a backside illumination type MOS solid-state imaging device is shown. Particularly in the drawing, a connection wire array in which a plurality of connection wires which electrically connects the first and the second semiconductor chip units is arranged and a shield wire portion between adjacent connection wires are shown. Since the configuration of the embodiment shown in FIGS. 3 and 4 described above can be applied to other configuration thereof, portions in FIG. 11 corresponding to those in FIGS. 3 and 4 are given the same reference numerals, and detailed description thereof will be omitted.

A solid-state imaging device 114 according to the seventh embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire array 109 is constituted by a plurality of the connection wires 67. For the connection wire array 109, connection wire groups 110 in which the connection wires 67 are arranged in plural stages in the vertical direction, that is, arranged in three stages in this example are arranged in plural columns in the horizontal direction, that is, arranged in four columns in the example. The connection conductor 68 and the penetrating connection conductor 69 in each connection wire 67 are connected each to the routing wires 40d and 53d (not shown in the drawing) corresponding to the vertical signal lines. In the drawing, the routing wires 40d and 53d are omitted, but the routing wires 40d and 53d are connected in the same pattern as in FIG. 4 described above. The routing wires 40d and 53d are formed extending in the arrow y direction.

In this example, in the connection wire array 109, the connection wire groups 110 corresponding to each column are divided by continuous shield wires 113 when viewed from the top. The shield wires 113 are formed in the following shape. The shield wires 113 include a shield wire portion 113a arranged between adjacent connection wire groups 110 so as to interpose each of the connection wire groups 110 in the both sides. In addition, the shield wires 113 include a shield wire portion 113d which closes the opposite side to the extension side of the routing wires of the connection wire group 110 in the first column are closed, and a shield wire portion 113e which closes the extension side of the routing wires of the connection wire group 110 in the fourth column. Furthermore, the shield wires 113 include a shield wire portion 113f which runs across between the connection wires 67 of the first and second stages of the connection wire group 110 in the second column and a shield wire portion 113g which runs across between the connection wires 67 of the third and fourth stages of the connection wire group 110 in the third column.

The shield wires 113 can be formed, for example, with a metal in a necessary layer in the multi-layered wiring layer 41 of the first semiconductor chip unit 22 side. Alternatively, the shield wires 113 can be formed with a metal in a necessary layer in the multi-layered wiring layer 55 of the second semiconductor chip unit 26 side. Alternatively, the shield wires 113 can be formed with a metal in the necessary layer of each of the multi-layered wiring layers 41 and 55 in the first and the second semiconductor chip units 22 and 26. In this case, the shield wires 113 of the above-described pattern are formed with the necessary metal in the multi-layered wiring layer 41, and the shield wires 113 of the above-described pattern are formed with the necessary metal in the multi-layered wiring layer 55. The shield wires 113 are given a ground potential.

According to the solid-state imaging device 114 according to the seventh embodiment, the shield wires 113 in the pattern shown in FIG. 11 shield the adjacent connection wire groups 110 some connection wires 67 in the vertical direction. For this reason, it is possible to suppress adjacent coupling capacity occurring between the adjacent connection wire groups 110 and some connection wires 67 in the vertical direction. When the shield wires 113 in the above-described pattern are formed with the metal in the multi-layered wiring layers 41 and 55, it is possible to easily reduce three-dimensional adjacent coupling capacity. Therefore, it is possible to provide a solid-state imaging device with high performance. The shield wires 113 are formed using metals constituting the multi-layered wiring layer 41 and/or 55. For this reason, since the shield wires 113 are formed in a process performed simultaneously with the pattern process of wiring of the multi-layered wiring layers 41 and 55, it is possible to manufacture the solid-state imaging device 114 of the embodiment without increasing the number of manufacturing processes.

Since the surface of the multi-layered wiring layers 41 and 55 becomes more even plane with the formation of the shield wires 113, the silicon substrate of the first semiconductor chip unit 22 is made into a thin file by, for example, CMP (Chemical Mechanical Polishing), or the like, thereby stabilizing the shape.

10. Eighth Embodiment

Configuration Example of Solid-State Imaging Device

Figure 12:
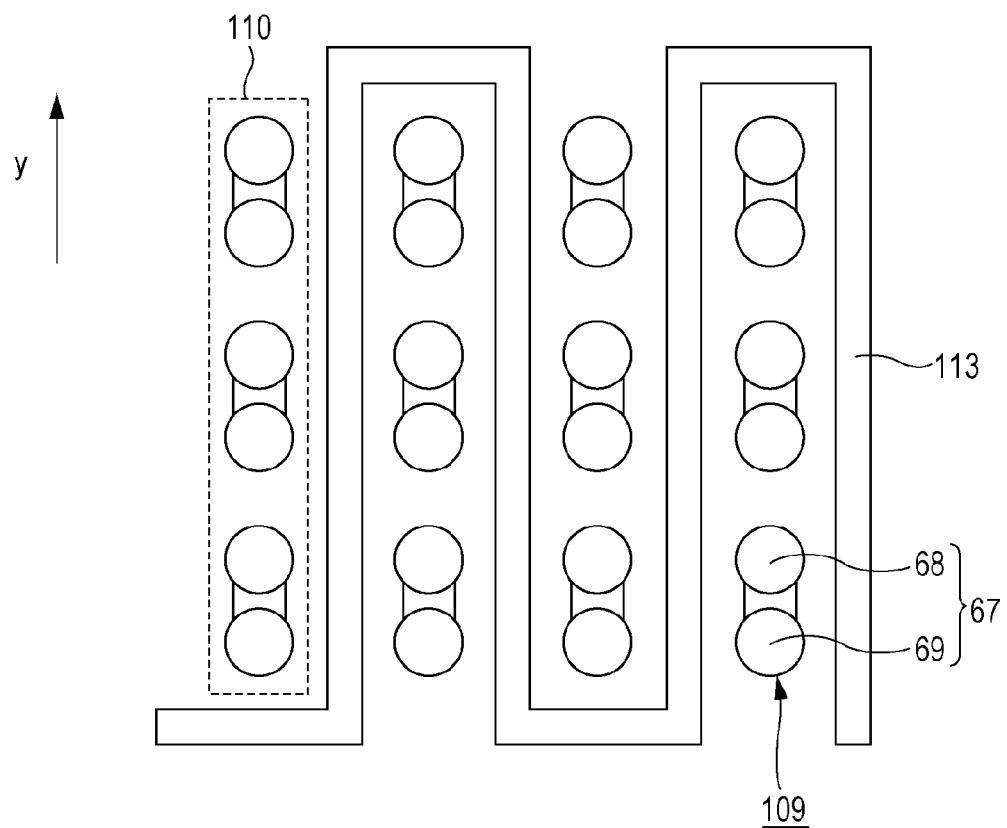
FIG. 12 is a plane diagram of principal portions showing an eighth embodiment of the solid-state imaging device according to the disclosure.

In FIG. 12, a solid-state imaging device according to the disclosure, that is, an eighth embodiment of a backside illumination type MOS solid-state imaging device is shown. Particularly in the drawing, a connection wire array in which a plurality of connection wires which electrically connects the first and the second semiconductor chip units is arranged and a shield wire portion between adjacent connection wires are shown. Since the configuration of the embodiment shown in FIGS. 3 and 4 described above can be applied to other configuration thereof, portions in FIG. 12 corresponding to those in FIGS. 3 and 4 are given the same reference numerals, and detailed description thereof will be omitted.

A solid-state imaging device 115 according to the eighth embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire array 109 is constituted by a plurality of the connection wires 67. For the connection wire array 109, connection wire groups 110 in which the connection wires 67 are arranged in plural stages in the vertical direction, that is, arranged in three stages in this example are arranged in plural columns in the horizontal direction, that is, arranged in four columns in the example. The connection conductor 68 and the penetrating connection conductor 69 in each connection wire 67 are connected each to the routing wires 40d and 53d (not shown in the drawing) corresponding to the vertical signal lines. In the drawing, the routing wires 40d and 53d are omitted, but the routing wires 40d and 53d are connected in the same pattern as in FIG. 4 described above. The routing wires 40d and 53d are formed extending in the arrow y direction.

In this example, in the connection wire array 109, the connection wire groups 110 corresponding to each column are divided by continuous shield wires 113 when viewed from the top. In other words, the shield wires 113 are formed in a continuous zigzag pattern so as to shield the connection wire groups 110 in each column therebetween.

The shield wires 113 can be formed, for example, with a metal in a necessary layer in the multi-layered wiring layer 41 of the first semiconductor chip unit 22 side. Alternatively, the shield wires 113 can be formed with a metal in a necessary layer in the multi-layered wiring layer 55 of the second semiconductor chip unit 26 side. Alternatively, the shield wires 113 can be formed with a metal in the necessary layer of each of the multi-layered wiring layers 41 and 55 in the first and the second semiconductor chip units 22 and 26. In this case, the shield wires 113 of the zigzag pattern are formed with the necessary metal in the multi-layered wiring layer 41, and the shield wires 113 of the zigzag pattern are formed with the necessary metal in the multi-layered wiring layer 55. The shield wires 113 are given a ground potential.

According to the solid-state imaging device 115 according to the eighth embodiment, since the shield wires 113 in the zigzag pattern shield the adjacent connection wire groups 110 therebetween, it is possible to suppress adjacent coupling capacity occurring between the adjacent connection wire groups 110. When the shield wires 113 in the zigzag pattern are formed with the metal in the multi-layered wiring layers 41 and 55, it is possible to easily reduce three-dimensional adjacent coupling capacity. Therefore, it is possible to provide a solid-state imaging device with high performance. The shield wires 113 are formed using metals constituting the multi-layered wiring layer 41 and/or 55. For this reason, since the shield wires 113 are formed in a process performed simultaneously with the pattern process of wiring of the multi-layered wiring layers 41 and 55, it is possible to manufacture the solid-state imaging device 115 of the embodiment without increasing the number of manufacturing processes.

Since the surface of the multi-layered wiring layers 41 and 55 becomes more even plane with the formation of the shield wires 113, the silicon substrate of the first semiconductor chip unit 22 is made into a thin file by, for example, CMP (Chemical Mechanical Polishing), or the like, thereby stabilizing the shape.

11. Ninth Embodiment

Configuration Example of Solid-State Imaging Device

Figure 13:
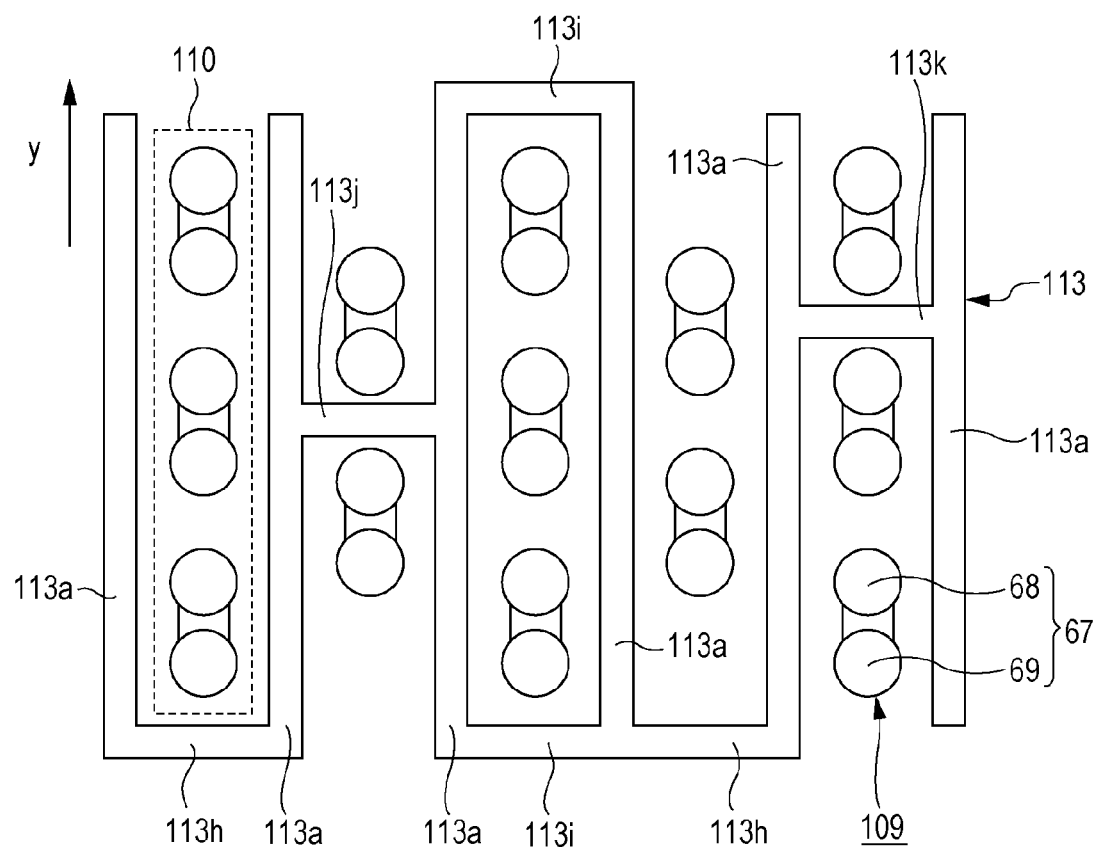
FIG. 13 is a plane diagram of principal portions showing a ninth embodiment of the solid-state imaging device according to the disclosure.

In FIG. 13, a solid-state imaging device according to the disclosure, that is, a ninth embodiment of a backside illumination type MOS solid-state imaging device is shown. Particularly in the drawing, a connection wire array in which a plurality of connection wires which electrically connects the first and the second semiconductor chip units is arranged and a shield wire portion between adjacent connection wires are shown. Since the configuration of the embodiment shown in FIGS. 3 and 4 described above can be applied to other configuration thereof, portions in FIG. 13 corresponding to those in FIGS. 3 and 4 are given the same reference numerals, and detailed description thereof will be omitted.

A solid-state imaging device 116 according to the ninth embodiment is configured such that the first semiconductor chip unit 22 and the second semiconductor chip unit 26 are bonded to each other, and the both semiconductor chip units 22 and 26 are connected by the connection wire 67 having the connection conductor 68 and the penetrating connection conductor 69. The connection wire array 109 is constituted by a plurality of the connection wires 67. The connection wire groups 110 in which the connection wire array 109 are arranged in plural stages in the vertical direction are arranged in a plurality of columns in the vertical direction, that is, arranged in five columns in this example. In this example, the connection wire groups 110 of the odd-numbered columns, which are first, third, and fifth columns, have the connection wires 67 of three stages and the connection wire groups 110 of the even-numbered columns, which are second and fourth columns, have the connection wires 67 of two stages. The connection conductor 68 and the penetrating connection conductor 69 in each connection wire 67 are connected each to the routing wires 40d and 53d (not shown in the drawing) corresponding to the vertical signal lines. In the drawing, the routing wires 40d and 53d are omitted, but the routing wires 40d and 53d are connected in the same pattern as in FIG. 4 described above. The routing wires 40d and 53d are formed extending in the arrow y direction.

In this example, in the connection wire array 109, the connection wire groups 110 corresponding to each column are divided by continuous shield wires 113 when viewed from the top. The shield wires 113 have a pattern as shown in the drawing. In other words, the shield wires 113 have a shield wire portion 113a arranged between the connection wire groups 110 so as to interpose the both sides of each of the connection wire groups 110. In addition, the shield wires 113 include a shield wire portion 113h with which the opposite side to the extension side of the routing wire of the connection wire groups 110 in the first and fourth columns is closed and s shield wire portion 113i which surrounds the connection wire group 110 in the third column with the shield wire portion 113a. Furthermore, the shield wires 113 includes a shield wire portion 113j which runs cross between the connection wires 67 in the second column and a shield wire portion 113k which runs cross between the connection wires 67 of the first stage and the second stage of the connection wire group 110 in the fourth column.

The shield wires 113 can be formed, for example, with a metal in a necessary layer in the multi-layered wiring layer 41 of the first semiconductor chip unit 22 side. Alternatively, the shield wires 113 can be formed with a metal in a necessary layer in the multi-layered wiring layer 55 of the second semiconductor chip unit 26 side. Alternatively, the shield wires 113 can be formed with a metal in the necessary layer of each of the multi-layered wiring layers 41 and 55 in the first and the second semiconductor chip units 22 and 26. In this case, the shield wires 113 of the above-described pattern are formed with the necessary metal in the multi-layered wiring layer 41, and the shield wires 113 of the above-described pattern are formed with the necessary metal in the multi-layered wiring layer 55. The shield wires 113 are given a ground potential.

According to the solid-state imaging device 116 according to the ninth embodiment, since the shield wires 113 of the pattern shown in FIG. 13 shield the adjacent connection wire groups 110 and some of the connection wires 67 in the vertical direction therebetween. For this reason, it is possible to suppress adjacent coupling capacity occurring between the adjacent connection wire groups 110 and some of the connection wires 67 in the vertical direction. When the shield wires 113 of the above-described pattern are formed with the metal in the multi-layered wiring layers 41 and 55, it is possible to easily reduce three-dimensional adjacent coupling capacity. Therefore, it is possible to provide the solid-state imaging device 116 with high performance. The shield wires 113 are formed using metals constituting the multi-layered wiring layer 41 and/or 55. For this reason, since the shield wires 113 are formed in a process performed simultaneously with the pattern process of wiring of the multi-layered wiring layers 41 and 55, it is possible to manufacture the solid-state imaging device 116 of the embodiment without increasing the number of manufacturing processes.

Since the surface of the multi-layered wiring layers 41 and 55 becomes more even plane with the formation of the shield wires 113, the silicon substrate of the first semiconductor chip unit 22 is made into a thin file by, for example, CMP (Chemical Mechanical Polishing), or the like, thereby stabilizing the shape.

TABLE

| | Fifth Embodiment | Sixth Embodiment | Seventh Embodiment | Eighth Embodiment | Ninth Embodiment |
| --- | --- | --- | --- | --- | --- |
| Total Capacity | 1.0 | 1.18 | 0.99 | 1.2 | 0.99 |
| Adjacent Coupling Capacity | 1.0 | 0.7 | 0.88 | 0.7 | 0.94 |

Table shows the comparison of the total capacity and the adjacent coupling capacity for each layout of the shield wires 113 of the solid-state imaging devices 111, 112, 114, 115, and 116 according to the fifth to the ninth embodiments. In Table, the total capacity and the adjacent coupling capacity of the solid-state imaging device 111 according to the fifth embodiment are set as references.

Herein, the adjacent coupling capacity is adjacent coupling capacity in total in the connection wire array 109. The total capacity is sum of capacity of adjacent coupling capacity, and other capacity (sum of capacity occurring between a substrate and a penetrating conductor and capacity occurring between a shield and a penetrating conductor).

As clear from Table, in the sixth embodiment, it is possible to drastically lower the adjacent coupling capacity. The total capacity is likely to increase. In the seventh embodiment, the total capacity and the adjacent coupling capacity can be lowered together. In the eighth embodiment, the total capacity can be lowered and the adjacent coupling capacity can be drastically lowered. In the ninth embodiment, the total capacity and the adjacent coupling capacity can be lowered together.

12. Tenth Embodiment

Configuration Example of Solid-State Imaging Device

Next, a solid-state imaging device according to the disclosure, that is a tenth embodiment of a backside illumination type MOS solid-state imaging device will be described. The solid-state imaging device according to the tenth embodiment is configured such that the shield wires 103 shown in the above-described first to fourth embodiments are appropriately combined with the shield wires 113 shown in the fifth to ninth embodiments, although not shown in a drawing.

According to the solid-state imaging device according to the tenth embodiment, it is possible to suppress adjacent coupling capacity occurring between a connection wire 67 and routing wires corresponding to a vertical signal line which are connected to another connection wire 67 adjacent thereto by the shield wire 103. At the same time, it is possible to suppress adjacent coupling capacity occurring between adjacent connection wire groups 110 (including some of the connection wires) by the shield wire 113. As such, with the arrangement of the shield wires 103 and 113, it is possible to further suppress three-dimensional adjacent coupling capacity. Therefore, it is possible to provide a solid-state imaging device with higher performance.

13. Eleventh Embodiment

Configuration Example of Electronic Equipment

The solid-state imaging devices according to the above-described disclosure can be applied to electronic equipment such as camera systems, for example, digital cameras, video cameras, and the like, mobile telephones having an imaging function, other equipment having the imaging function, and the like.

Figure 14:
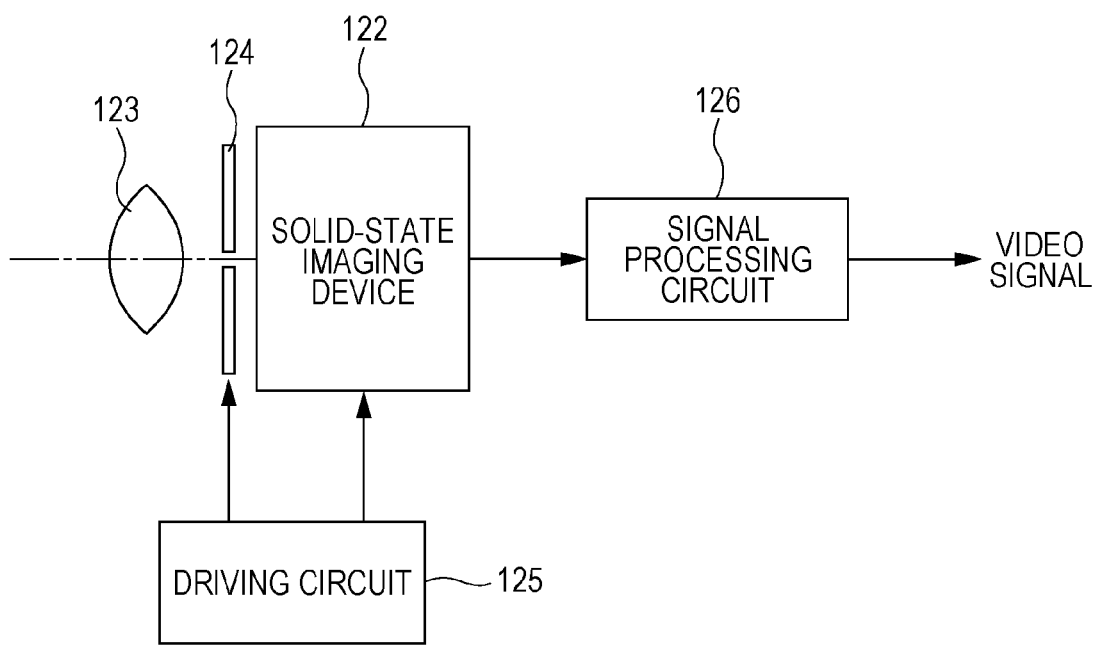
FIG. 14 is an outlined configuration diagram showing electronic equipment according to an eleventh embodiment of the disclosure.

FIG. 14 shows an eleventh embodiment applied to a camera as an example of electronic equipment according to the disclosure. The camera according to the embodiment is an example of a video camera that can capture still images or moving images. The camera 121 of the embodiment includes a solid-state imaging device 122, an optical system 123 which guides incident light to a light receiving sensor unit of the solid-state imaging device 122, and a shutter device 124. Furthermore, the camera 121 includes a driving circuit 125 which drives the solid-state imaging device 122, and a signal processing circuit 126 which processes output signals of the solid-state imaging device 122.

Any of the solid-state imaging devices of the above-described embodiments is applied to the solid-state imaging device 122. The optical system (optical lens) 123 forms an image on the imaging surface of the solid-state imaging device 122 with image light (incident light) from a subject. Accordingly, signal charges are accumulated in the solid-state imaging device 122 for a certain period of time. The optical system 123 may be an optical lens system constituted by a plurality of optical lenses. The shutter device 124 controls a light irradiation period and a light shielding period for the solid-state imaging device 122. The driving circuit 125 supplies driving signals for controlling a transfer operation of the solid-state imaging device 122 and a shutter operation of the shutter device 124. The solid-state imaging device 122 transfers signals with the driving signals (timing signals) supplied from the driving circuit 125. The signal processing circuit 126 performs processing of various signals. Video signals subjected to the signal processing are stored in a storage medium such as a memory, or output to a monitor.

According to the electronic equipment such as a camera according to the eleventh embodiment, it is intended to make the solid-state imaging device 122 have high performance, whereby it is possible to provide electronic equipment with high reliability.

The present disclosure contains subject matter related to that disclosed in Japanese Priority Patent Application JP 2010-236420 filed in the Japan Patent Office on Oct. 21, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A backside illumination type solid-state imaging device, comprising:
    stacked semiconductor chips with two or more semiconductor chip units are bonded to each other, at least a first semiconductor chip unit comprising a pixel array and a first multi-layered wiring layer, and a second semiconductor chip unit comprising a logic circuit and a second multi-layered wiring layer;
    a plurality of connection wires arranged horizontally along the first multi-layered wiring layer, each connection wire associated with a stacked semiconductor chip and which connects the first semiconductor chip unit and the second semiconductor chip unit;
    a first and second routing wire, each routing wire connecting adjacent connection wires; and
    a first shield wire configured to shield a gap between one of the routing wires and adjacent connection wires,
    wherein,
        each connection wire includes, a penetrating connection conductor which penetrates the first semiconductor chip unit and connects to a second connection pad connected to a necessary second wire in the second multi-layered wiring layer.

2. The solid-state imaging device according to claim 1, further comprising:
    a second shield wire configured to shield the gap between the second routing wire and adjacent connection wires.

3. The solid-state imaging device according to claim 1, wherein the first shield wire between adjacent connection wires is continuous and the connection wires are arranged in columns separated by the first shield wire.

4. The solid-state imaging device according to claim 3, wherein the pixel array includes (a) a photoelectric conversion unit and (b) a plurality of pixels arranged in a matrix, each pixel including a pixel transistor and (c) a vertical signal line commonly connected to pixels in the same column of the matrix, and
    the vertical signal line corresponds to the first routing wire.

5. The solid-state imaging device according to claim 4, wherein the entire semiconductor portion in a part of the first semiconductor chip unit is removed, and the connection wire is formed in this area.

6. A backside illumination type solid-state imaging device, comprising:
    stacked semiconductor chips which are formed such that two or more semiconductor chip units are bonded to each other, at least a first semiconductor chip unit comprising a pixel array and a first multi-layered wiring layer, and a second semiconductor chip unit comprising a logic circuit and a second multi-layered wiring layer;
    a connection wire which connects the first semiconductor chip unit and the second semiconductor chip unit; and
    a second shield wire which shields the connection wire and a first wire and a second wire which connect to another connection wire adjacent thereto,
    wherein,
        the connection wire a penetrating connection conductor which penetrates the first semiconductor chip unit and connects to a second connection pad connected to a necessary second wire in the second multi-layered wiring layer, and the second shield wire is formed with a wiring in a necessary layer in the first multi-layered wiring layer and the second multi-layered wiring layer.

7. The solid-state imaging device according to claim 6, wherein the pixel array includes (a) a photoelectric conversion unit, (b) a plurality of pixels arranged in a matrix, each pixel including a pixel transistor, and (c) a vertical signal line connected to pixels in each column of the matrix, and where the vertical signal line corresponds to the first routing wire.

8. The solid-state imaging device according to claim 7, wherein a portion of the semiconductor containing the first semiconductor chip unit is removed, and the connection wire associated with the first semiconductor chip is formed therein.

9. An electronic equipment comprising:
    a solid-state imaging device;
    an optical system configured to guide incident light to a photodiode of the solid-state imaging device; and
    a signal processing circuit configured to process output signals of the solid-state imaging device, the solid-state imaging device including (a) stacked semiconductor chips with two or more semiconductor chip units are bonded to each other, at least a first semiconductor chip unit comprising a pixel array and a first multi-layered wiring layer, and a second semiconductor chip unit comprising a logic circuit and a second multi-layered wiring layer (b) a plurality connection wires arranged horizontally along the first multi-layered wiring layer, each connection wire associated with a stacked semiconductor chip and which connects the first semiconductor chip unit and the second semiconductor chip unit, (c) a first and second routing wire, each routing wire connecting adjacent connection wires, and (d) a first shield wire configured to shield a gap between one of the routing wires and adjacent connection wires wherein, each connection wire includes a penetrating connection conductor which penetrates the first semiconductor chip unit and connects to a second connection pad connected to a necessary second wire in the second multi-layered wiring layer.

10. The electronic equipment according to claim 9, wherein the solid-state imaging device further includes a second shield wire configured to shield the gap between the second routing wire and adjacent connection wires.

11. The electronic equipment according to claim 9, wherein the first shield wire between adjacent connection wires is continuous and the connection wires are arranged in columns separated by the first shield wire.

12. The electronic equipment according to claim 11, wherein the pixel array includes (a) a photoelectric conversion unit and (b) a plurality of pixels arranged in a matrix, each pixel including a pixel transistor and (c) a vertical signal line commonly connected to pixels in each column of the matrix, and the vertical signal line corresponds to the first routing wire.

13. The electronic equipment according to claim 12, wherein a portion of the semiconductor containing the first semiconductor chip unit is removed, and the connection wire associated with the first semiconductor chip is formed therein.

14. Electronic equipment comprising:

a solid-state imaging device;

an optical system configured to guide incident light to a photodiode of the solid-state imaging device; and a signal processing circuit configured to process output signals of the solid-state imaging device, wherein, the solid-state imaging device includes (a) stacked semiconductor chips with two or more semiconductor chip units are bonded to each other, at least a first semiconductor chip unit comprising a pixel array and a first multi-layered wiring layer, and a second semiconductor chip unit comprising a logic circuit and a second multi-layered wiring layer, (b) a plurality of connection wires arranged horizontally along the first multi-layered wiring layer, each connection wire associated with a stacked semiconductor chip and which connects the first semiconductor chip unit and the second semiconductor chip unit (c) a first and second routing wire, each routing wire connecting adjacent connection wires, and (d) a first shield wire configured to shield a gap between one of the routing wires and adjacent connection wires, and a each connection wire includes a penetrating connection conductor which penetrates the first semiconductor chip unit and being connected to a second connection pad connected to a necessary second wire in the second multi-layered wiring layer.

15. The electronic equipment according to claim 14, wherein the pixel array includes (a) a photoelectric conversion unit, (b) a plurality of pixels arranged in a matrix, each pixel including a transistor and (c) a vertical signal line commonly connected to pixels in each column of the matrix, and the vertical signal line corresponds to the first routing wire.

16. The electronic equipment according to claim 15, wherein a portion of the semiconductor containing the first semiconductor chip unit is removed, and the connection wire associated with the first semiconductor chip is formed therein.

* * * * *